(12) United States Patent
Lu et al.

(10) Patent No.: US 11,839,080 B2
(45) Date of Patent: Dec. 5, 2023

(54) 3D MEMORY WITH GRAPHITE CONDUCTIVE STRIPS

(71) Applicant: Taiwan Semiconductor Manufacturing Co., Ltd., Hsin-Chu (TW)

(72) Inventors: Chun-Chieh Lu, Taipei (TW); Sai-Hooi Yeong, Zhubei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 257 days.

(21) Appl. No.: 17/113,296

(22) Filed: Dec. 7, 2020

(65) Prior Publication Data

US 2021/0375917 A1  Dec. 2, 2021

Related U.S. Application Data

(60) Provisional application No. 63/031,025, filed on May 28, 2020.

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5221* (2013.01); *H10B 41/10* (2023.02); *H10B 41/27* (2023.02); *H10B 43/10* (2023.02)

(58) Field of Classification Search
CPC .... C01B 32/182–198; C01B 32/30–39; H01L 21/02115; H01L 27/11273;
(Continued)

(56) References Cited

U.S. PATENT DOCUMENTS 11,495,542 B2 * 11/2022 Kim ..................... H10B 41/10
2010/0105834 A1 * 4/2010 Tour ..................... C01B 32/184
423/447.2
(Continued)

FOREIGN PATENT DOCUMENTS

TW     I681548 B    1/2020
TW     I692038 B    4/2020

*Primary Examiner* — Amar Movva
(74) *Attorney, Agent, or Firm* — Eschweiler & Potashnik, LLC

(57) ABSTRACT

A process of forming a three-dimensional (3D) memory array includes forming a stack having a plurality of conductive layers of carbon-based material separated by dielectric layers. Etching trenches in the stack divides the conductive layers into conductive strips. The resulting structure includes a two-dimensional array of horizontal conductive strips. Memory cells may be distributed along the length of each strip to provide a 3D array. The conductive strips together with additional conductive structure that may have a vertical or horizontal orientation allow the memory cells to be addressed individually. Forming the conductive layers with carbon-based material facilitate etching the trenches to a high aspect ratio. Accordingly, forming the conductive layers of carbon-based material enables the memory array to have more layers or to have a higher area density.

20 Claims, 27 Drawing Sheets

(51) Int. Cl.
*H10B 41/10* (2023.01)
*H10B 41/27* (2023.01)
*H10B 43/10* (2023.01)

(58) Field of Classification Search
CPC ........... H01L 27/1128; H01L 27/11514; H01L 27/11551; H01L 27/11553; H01L 27/11556; H01L 27/11578; H01L 27/1158; H01L 27/11582; H01L 27/11597; H01L 27/2481; H01L 27/249; C23C 14/0605–0611; C23C 16/26–279; H10B 20/40–65; H10B 53/20; H10B 41/20–27; H10B 43/20–27; H10B 51/20; H10B 63/84–845
See application file for complete search history.

(56) References Cited

U.S. PATENT DOCUMENTS

| | | | |
|---|---|---|---|
| 2015/0292080 A1* | 10/2015 | Tsang | H01J 37/32422 |
| | | | 502/185 |
| 2016/0071861 A1* | 3/2016 | Serov | H01L 29/7827 |
| | | | 438/257 |
| 2016/0284811 A1 | 9/2016 | Yu et al. | |
| 2018/0182769 A1* | 6/2018 | Cheng | G11C 16/0483 |
| 2019/0148393 A1 | 5/2019 | Lue | |
| 2019/0312050 A1 | 10/2019 | Lai et al. | |
| 2020/0075631 A1 | 3/2020 | Dong et al. | |
| 2020/0098774 A1 | 3/2020 | Yeh et al. | |

* cited by examiner

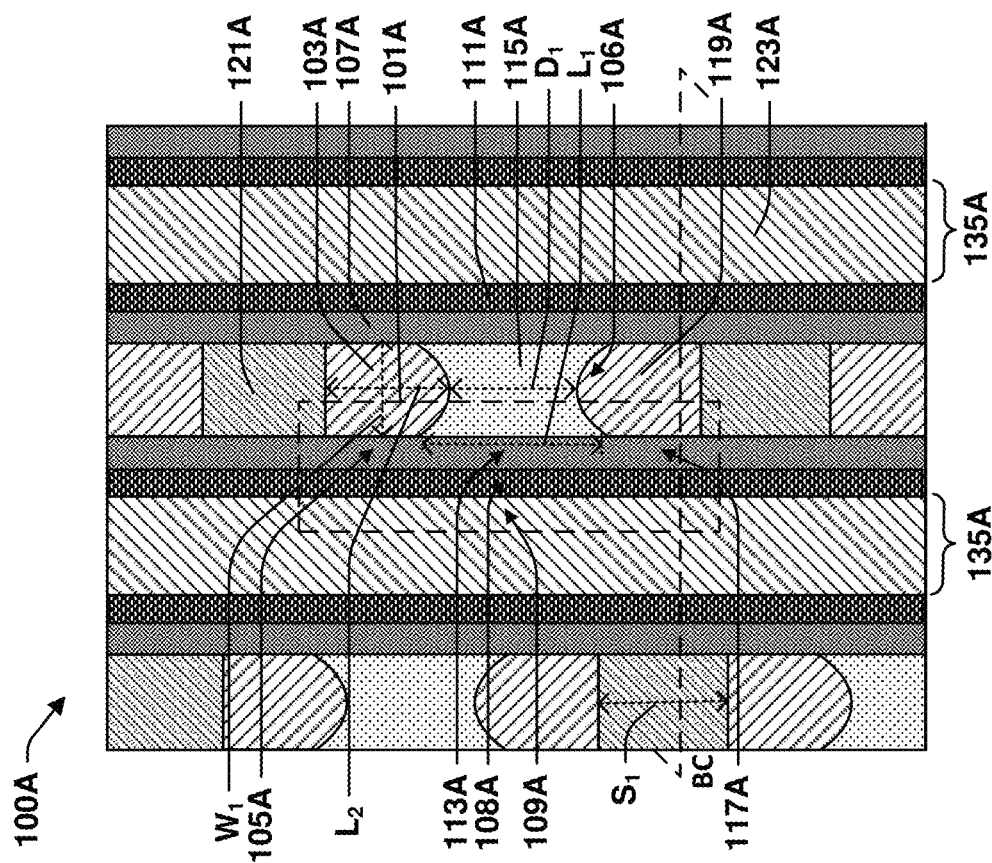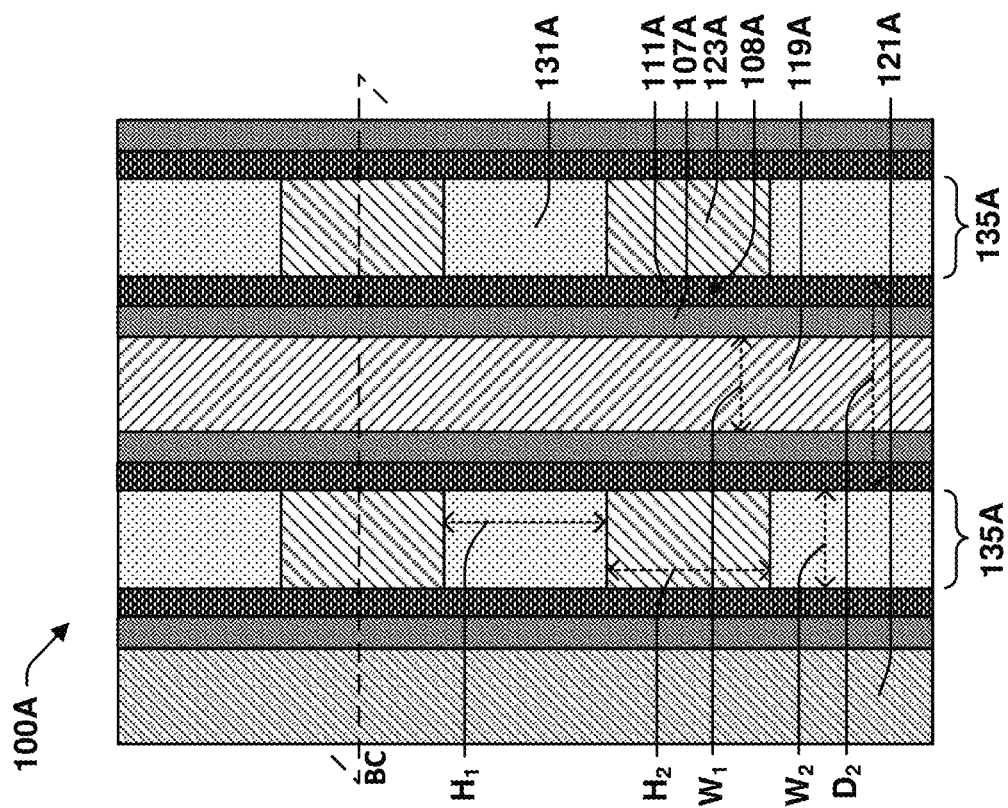

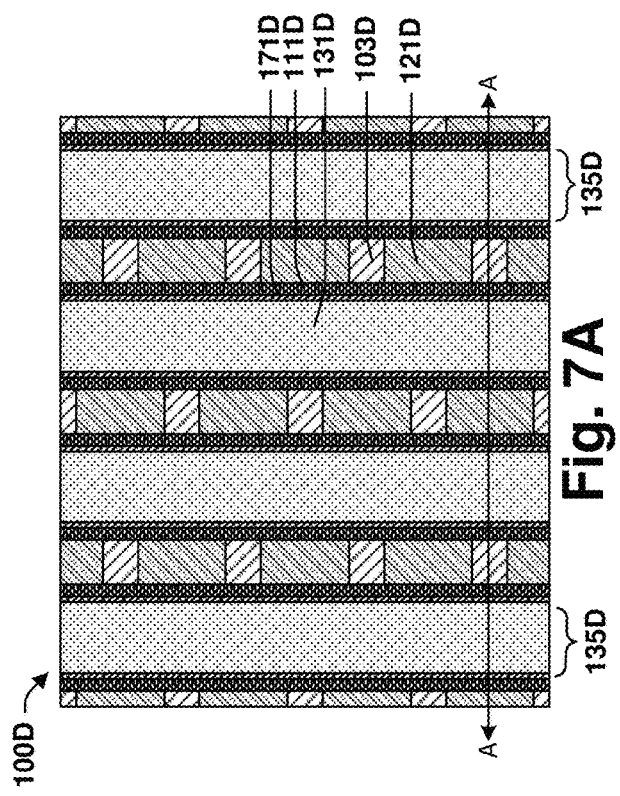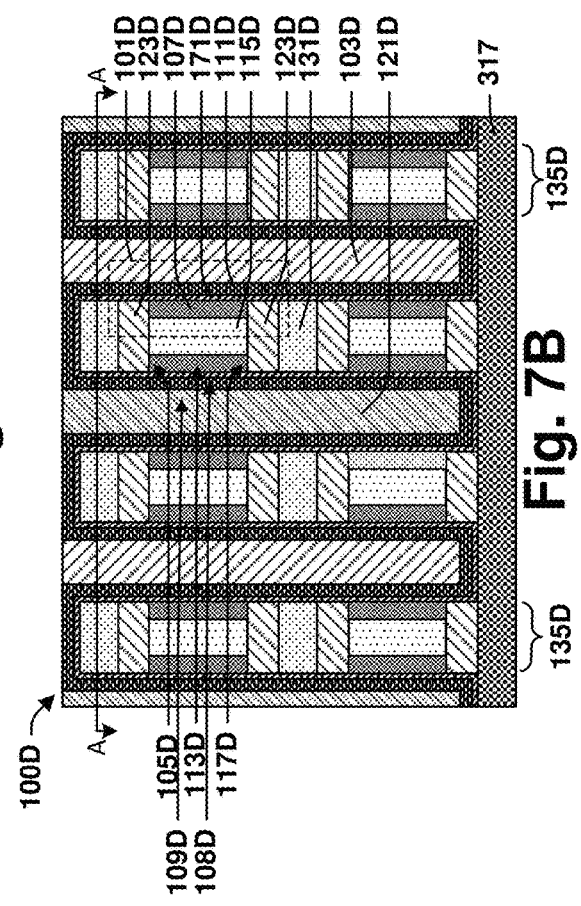

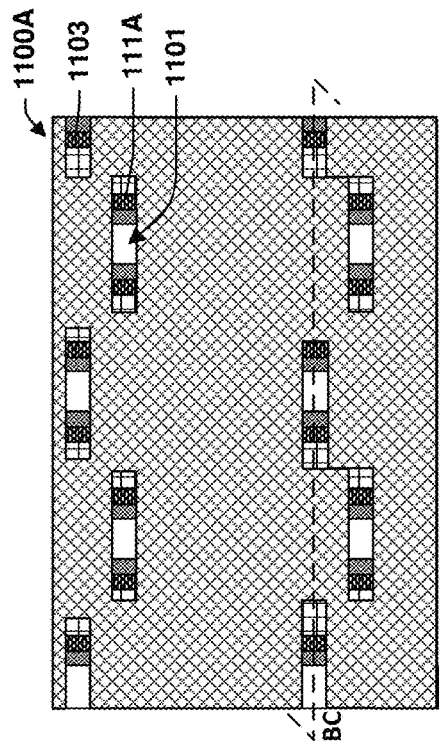
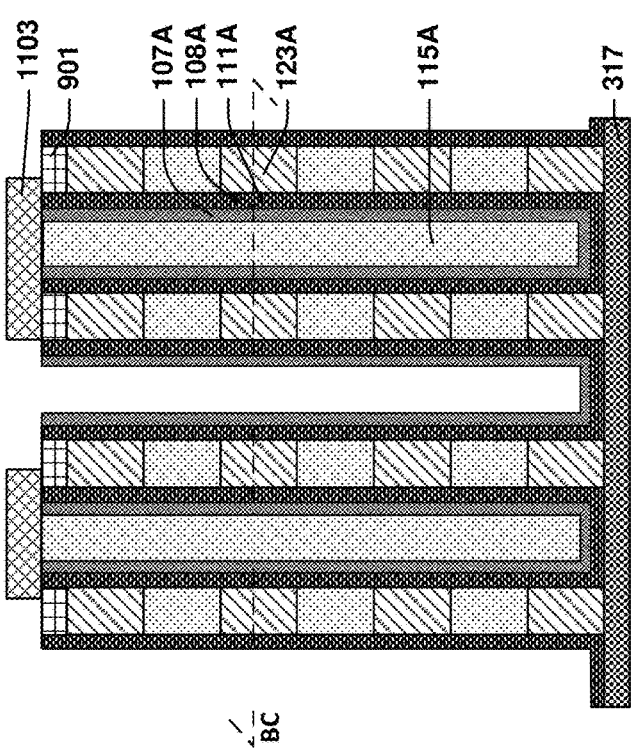
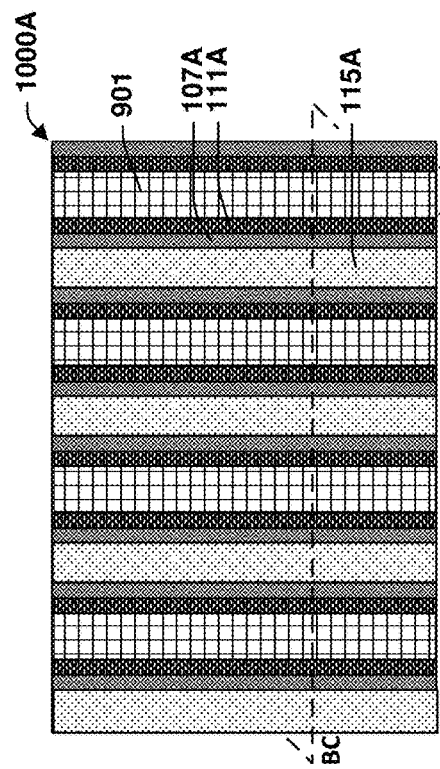
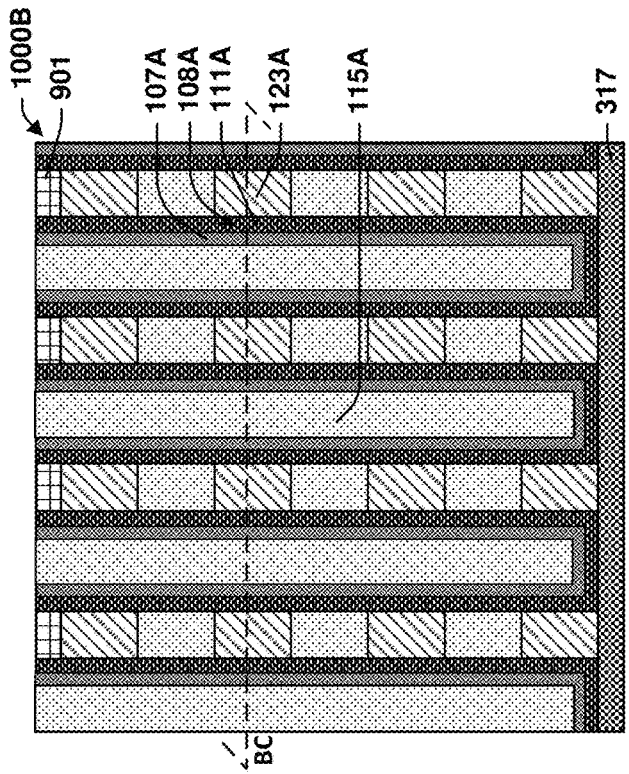

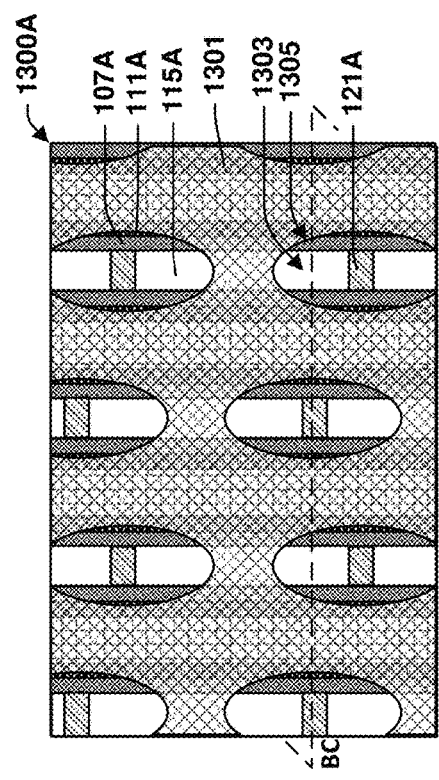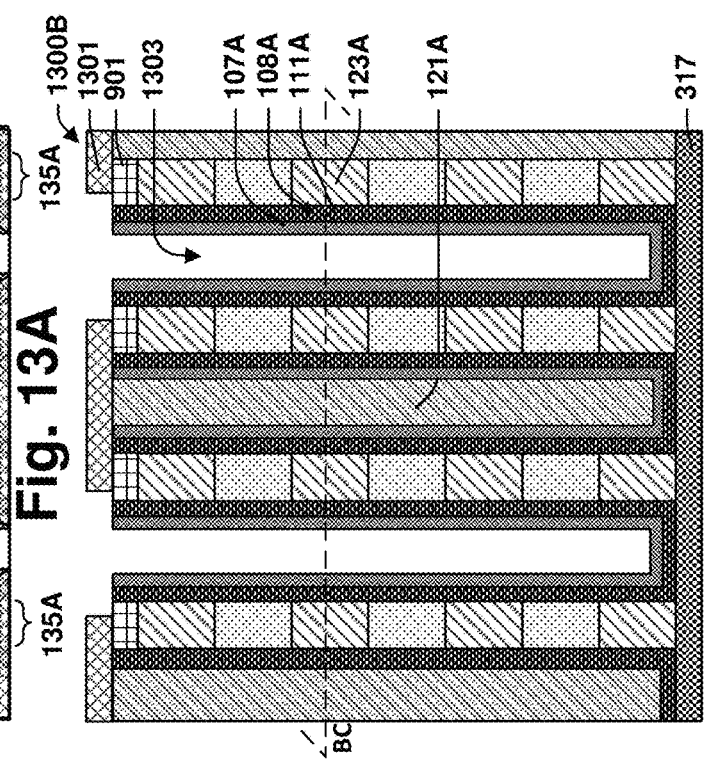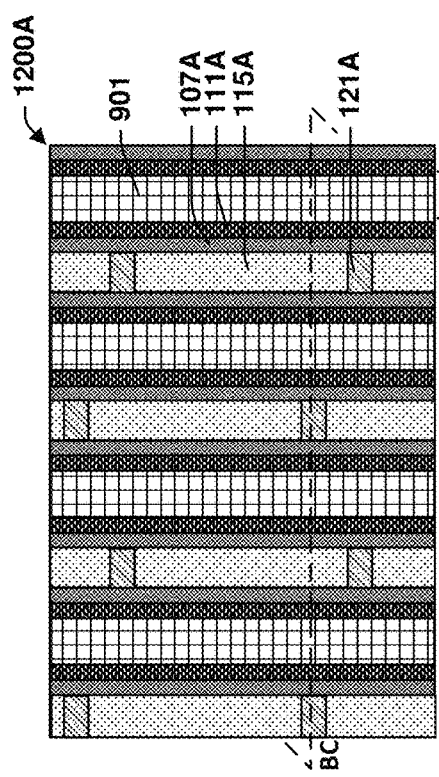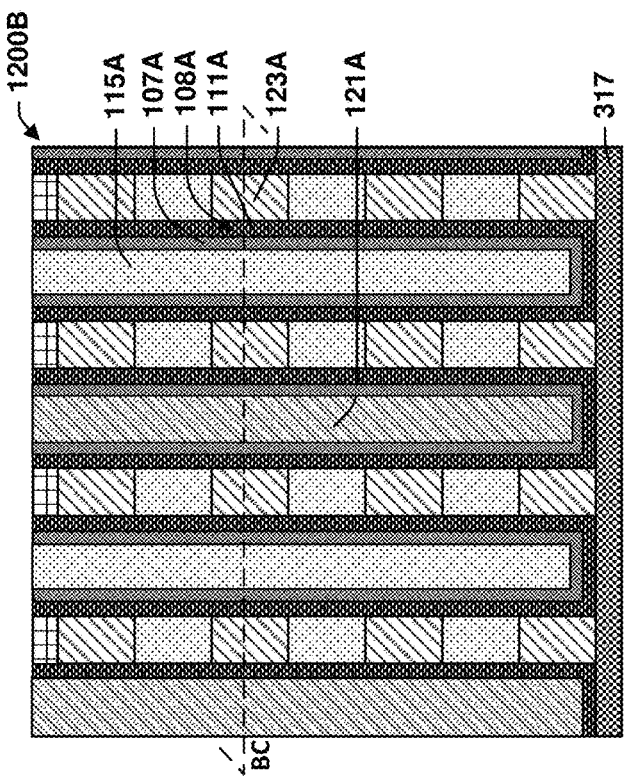

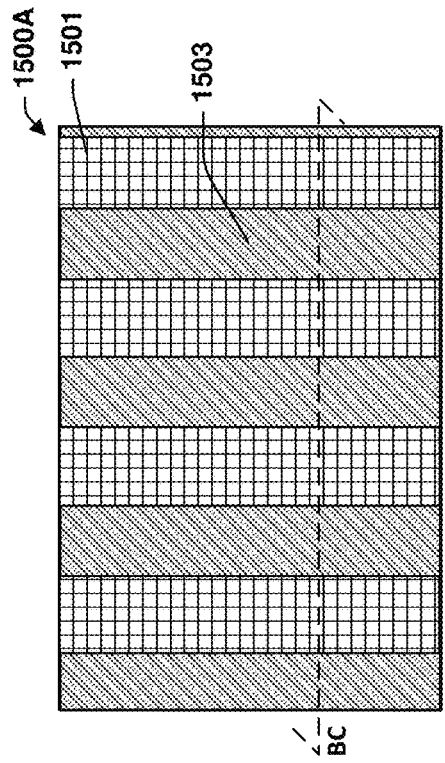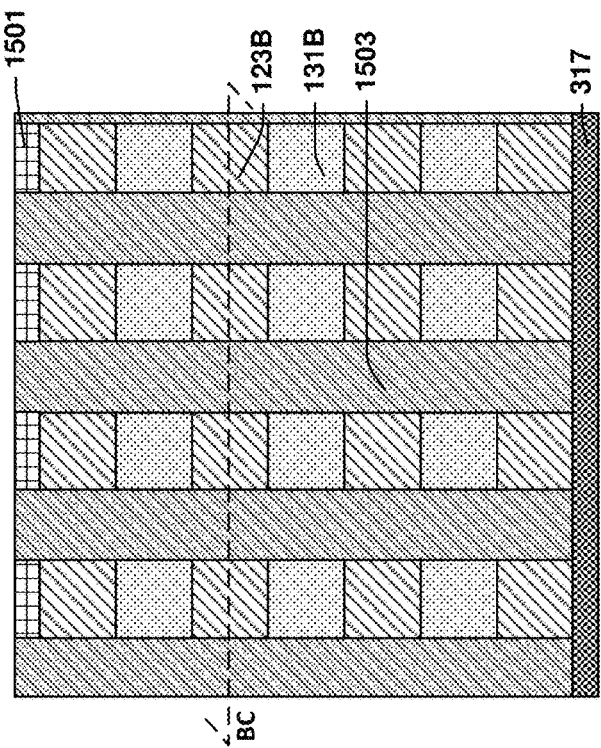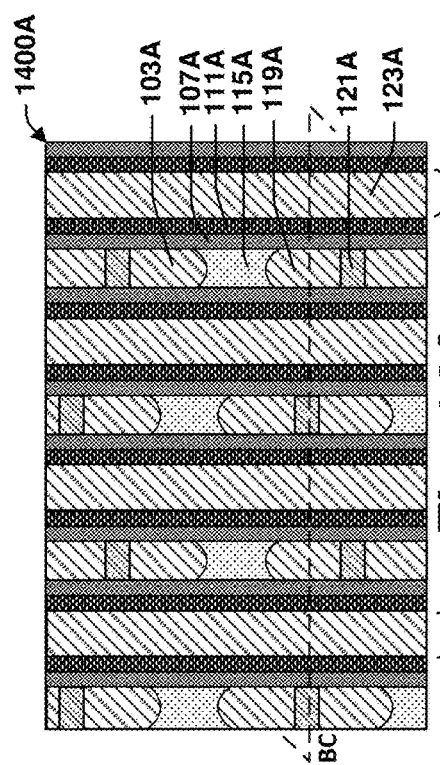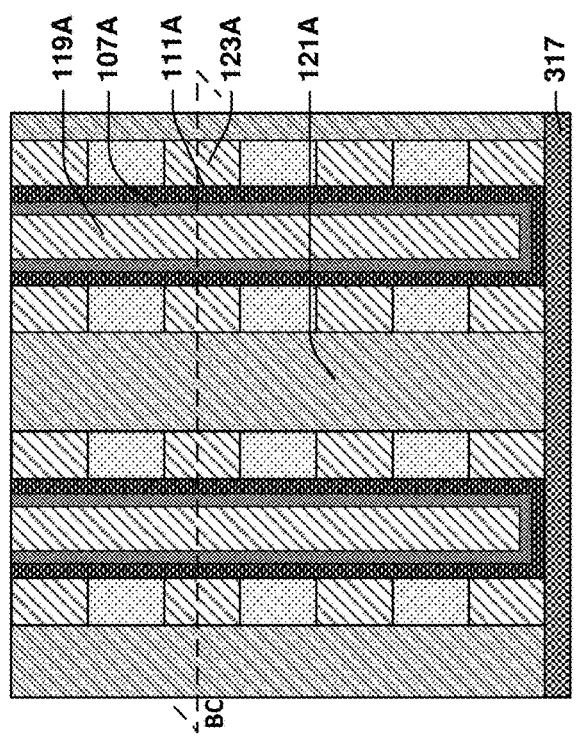

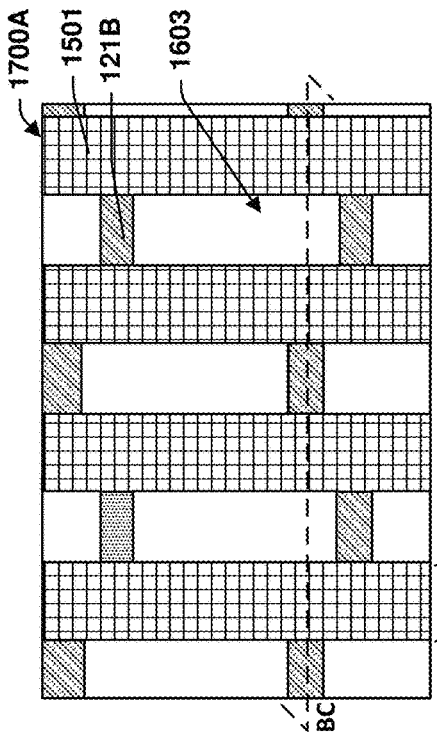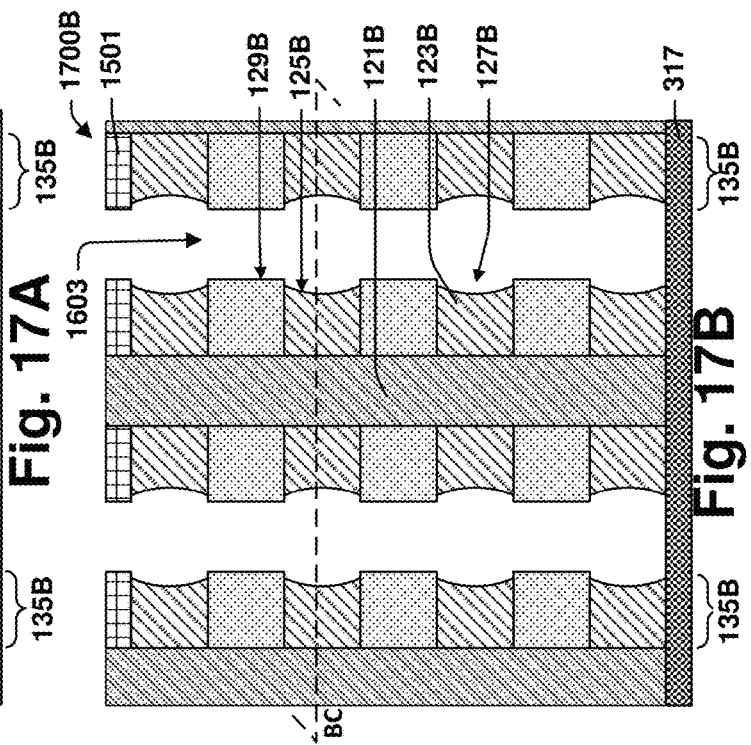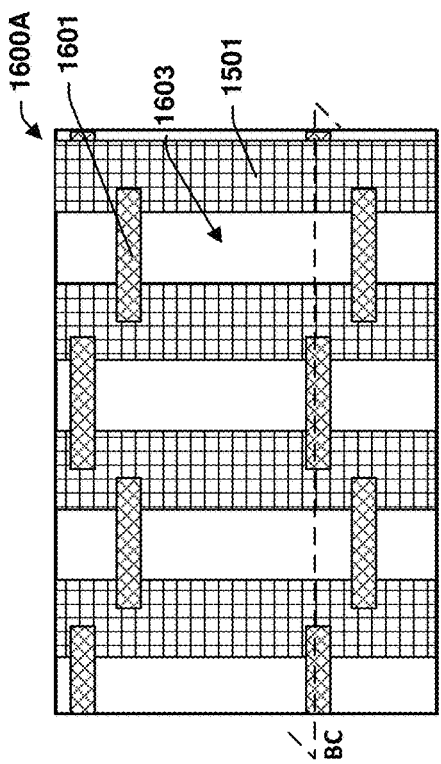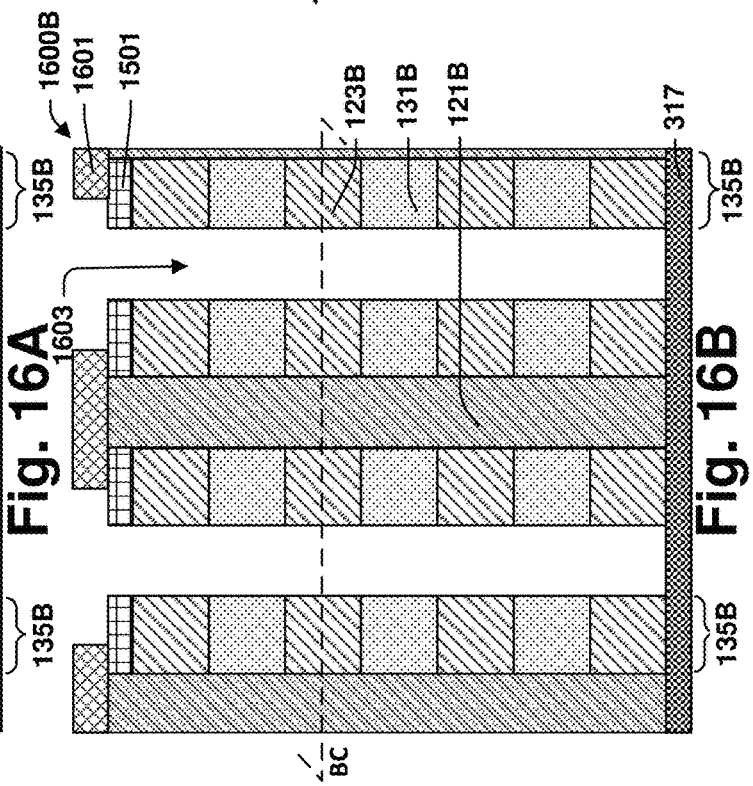

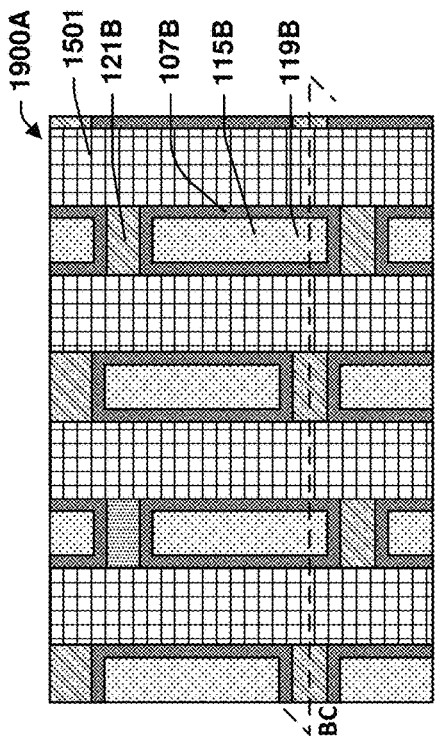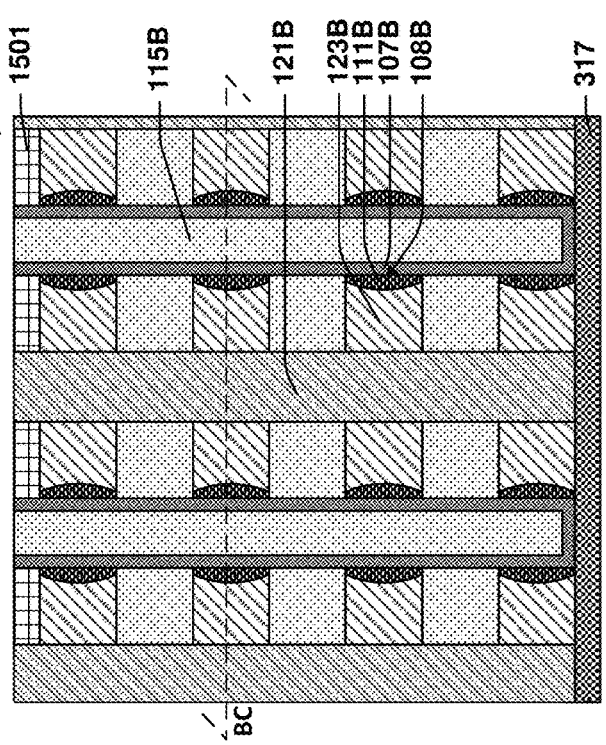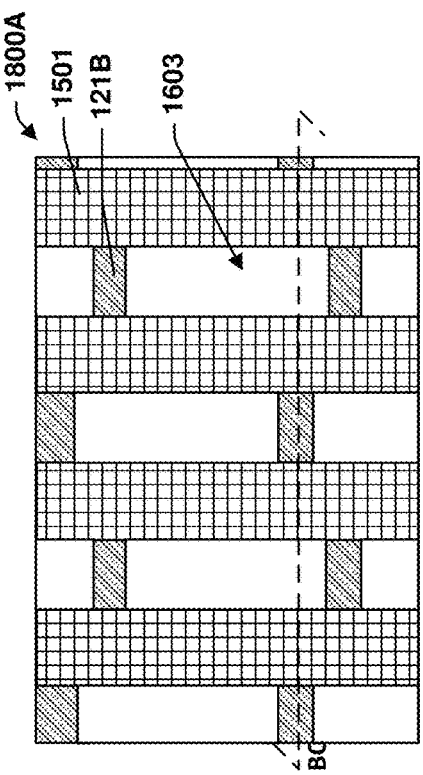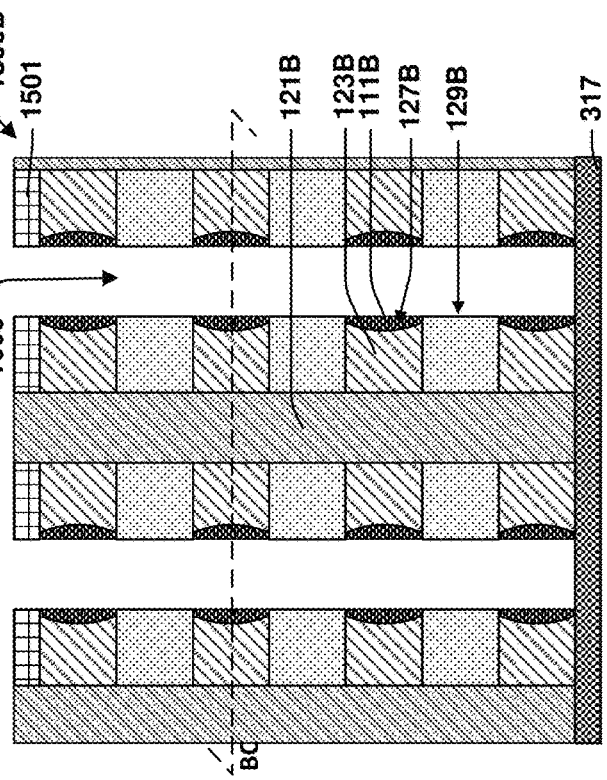

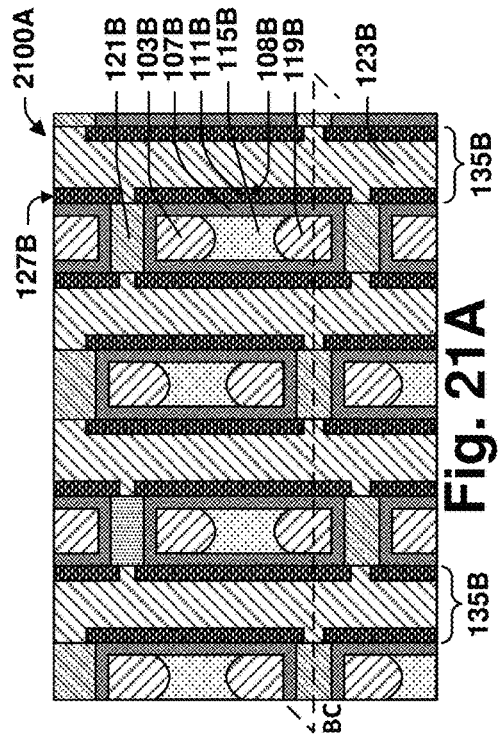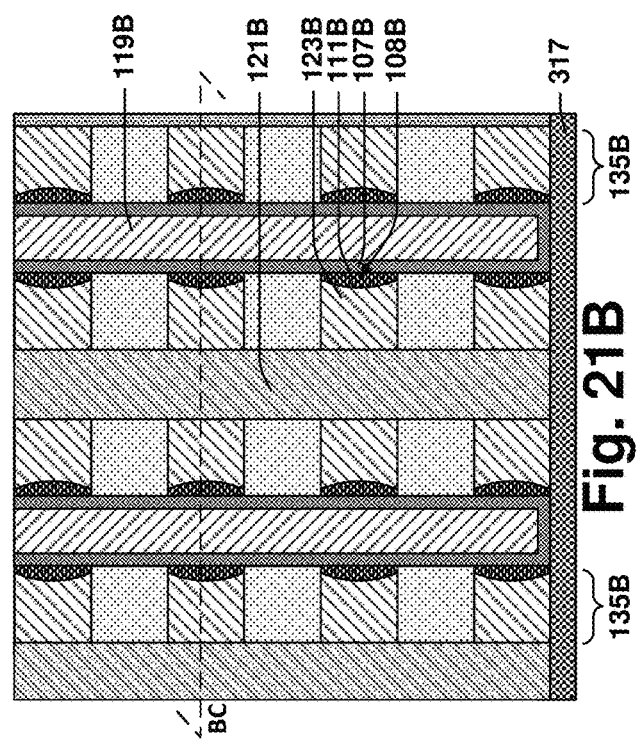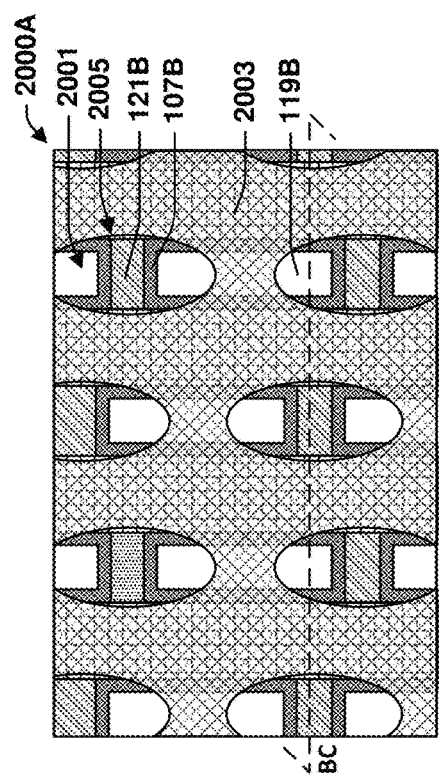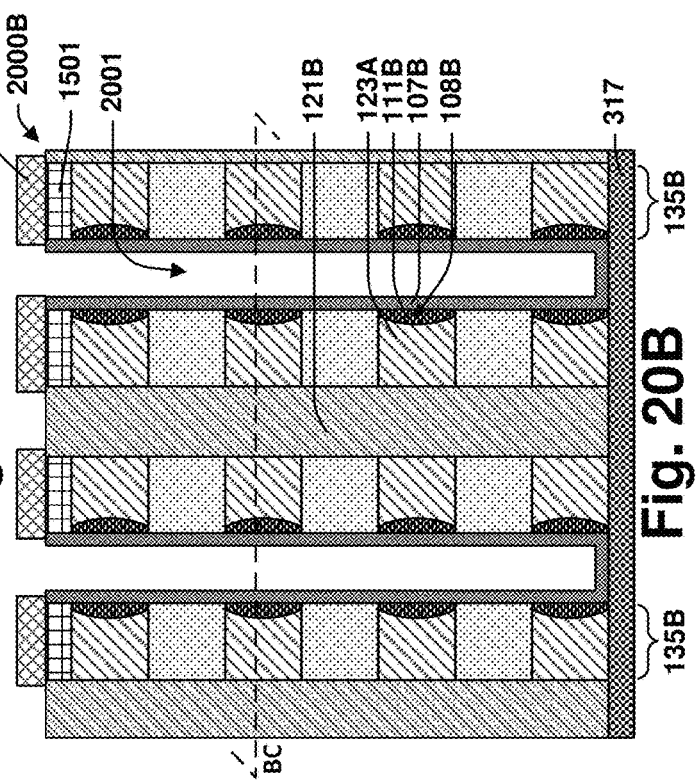

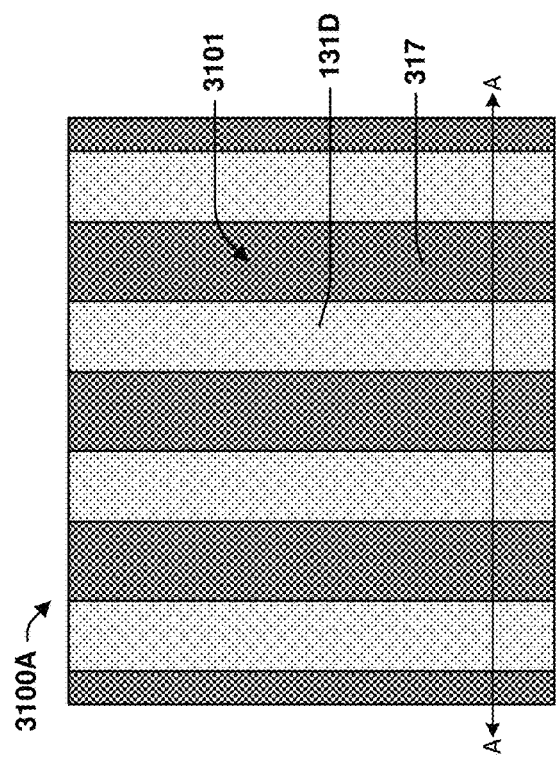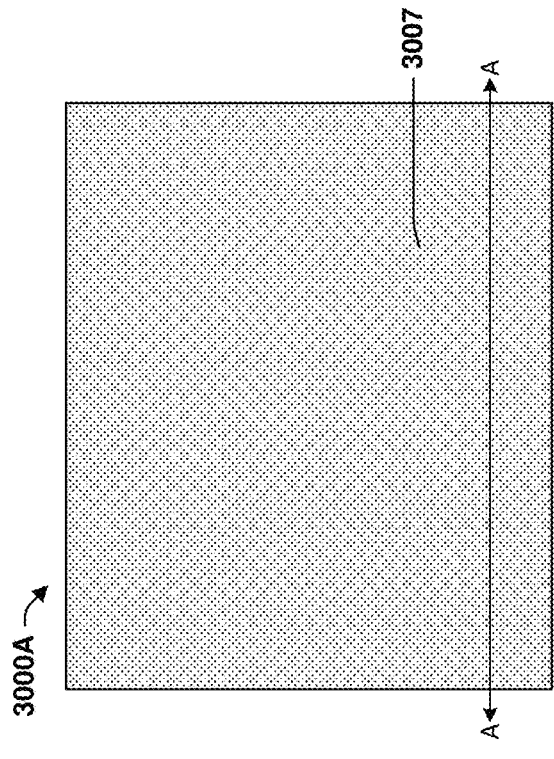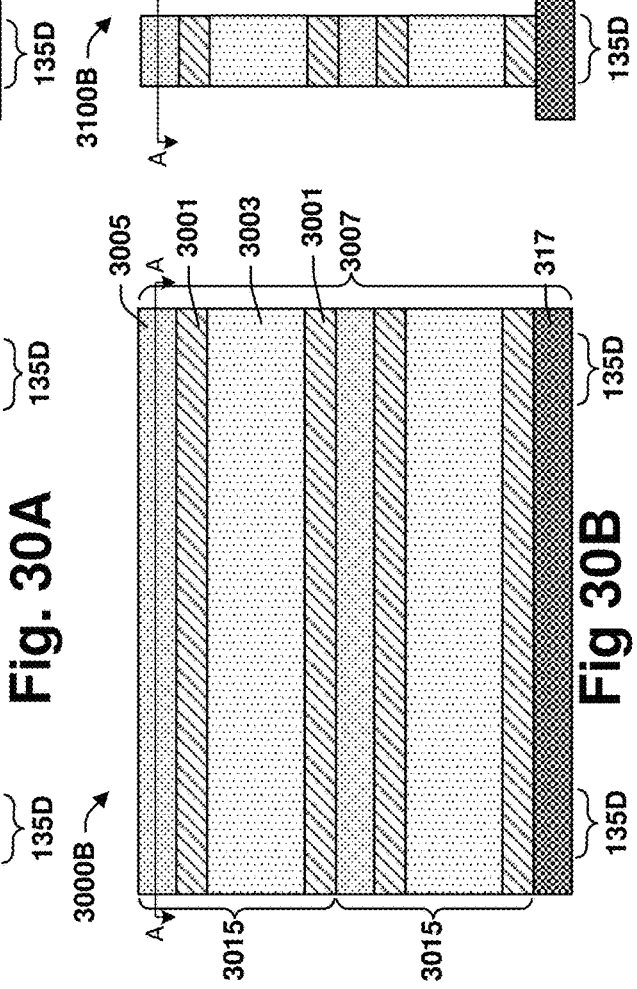

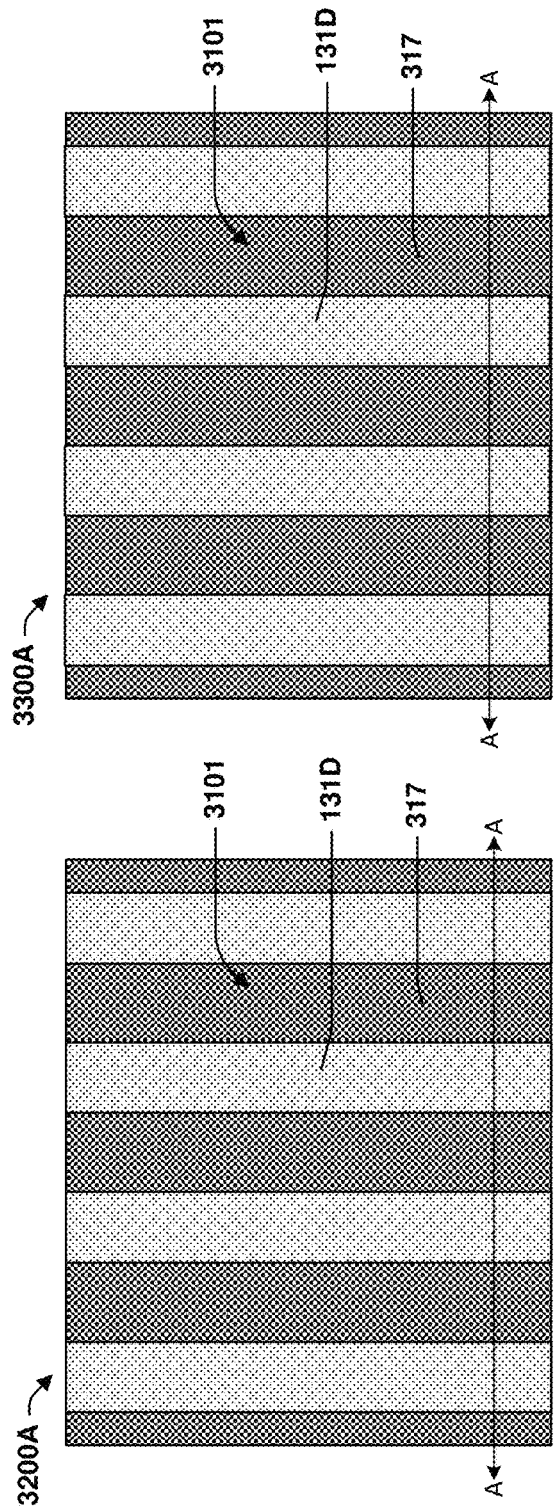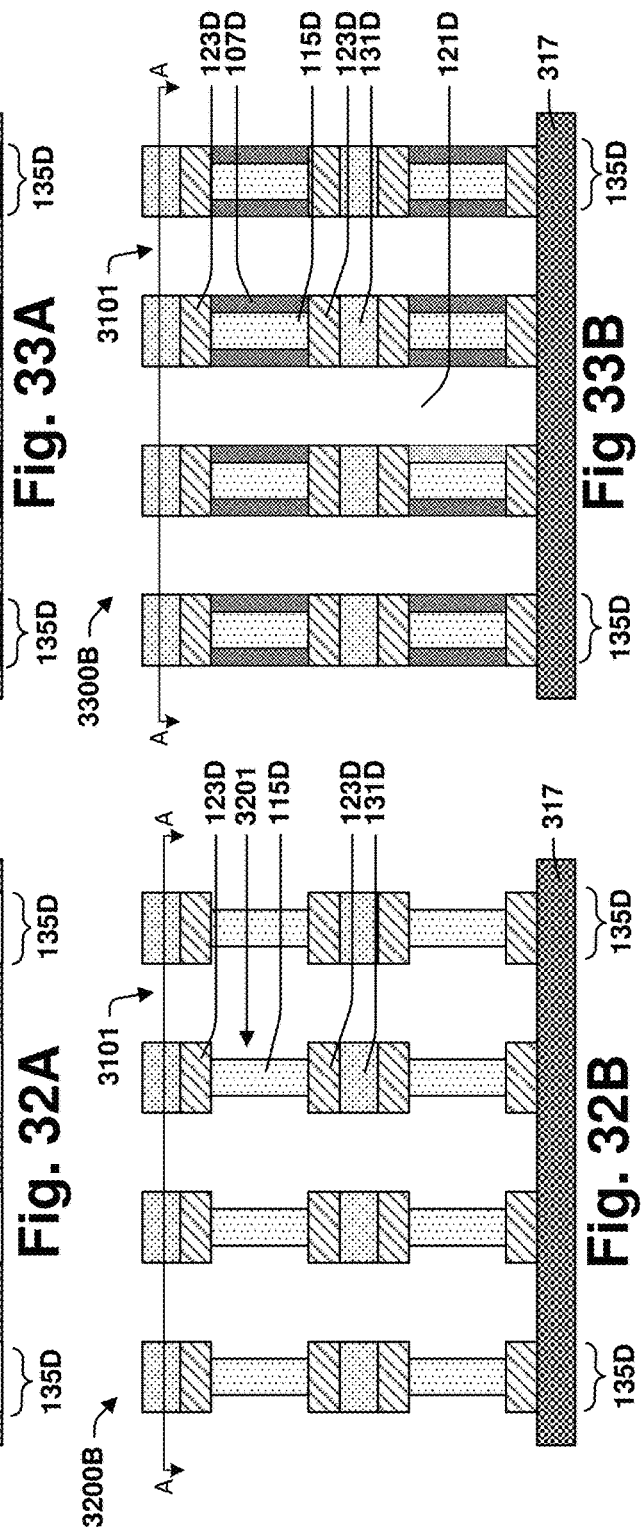

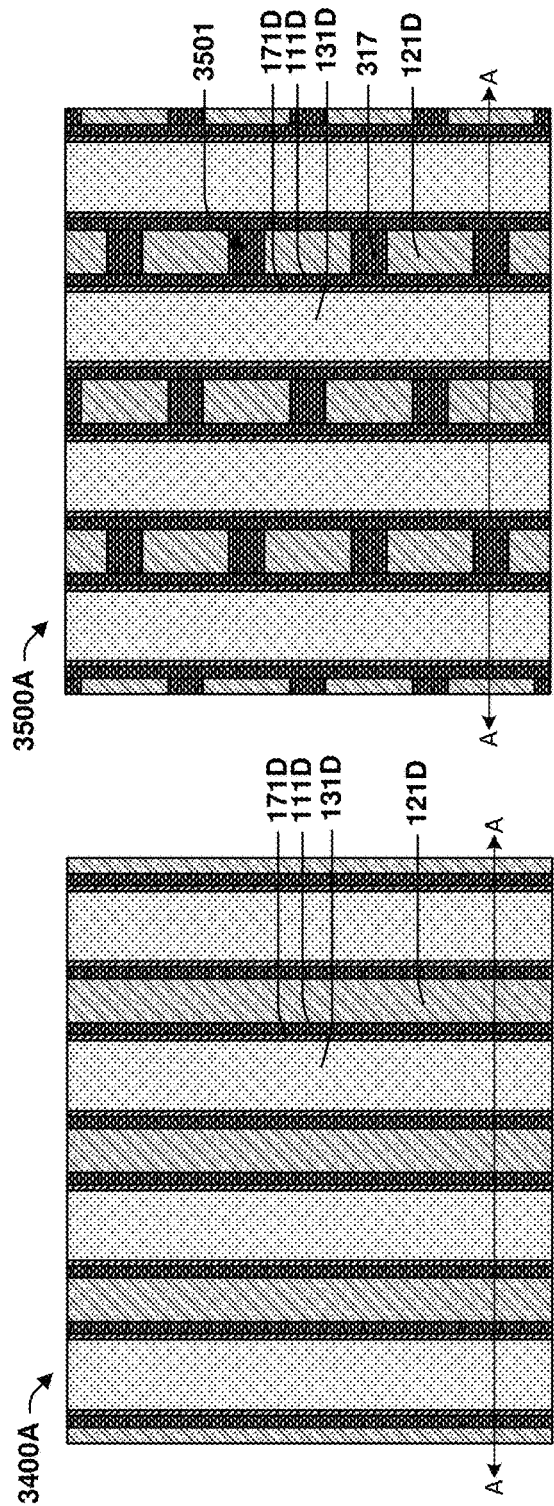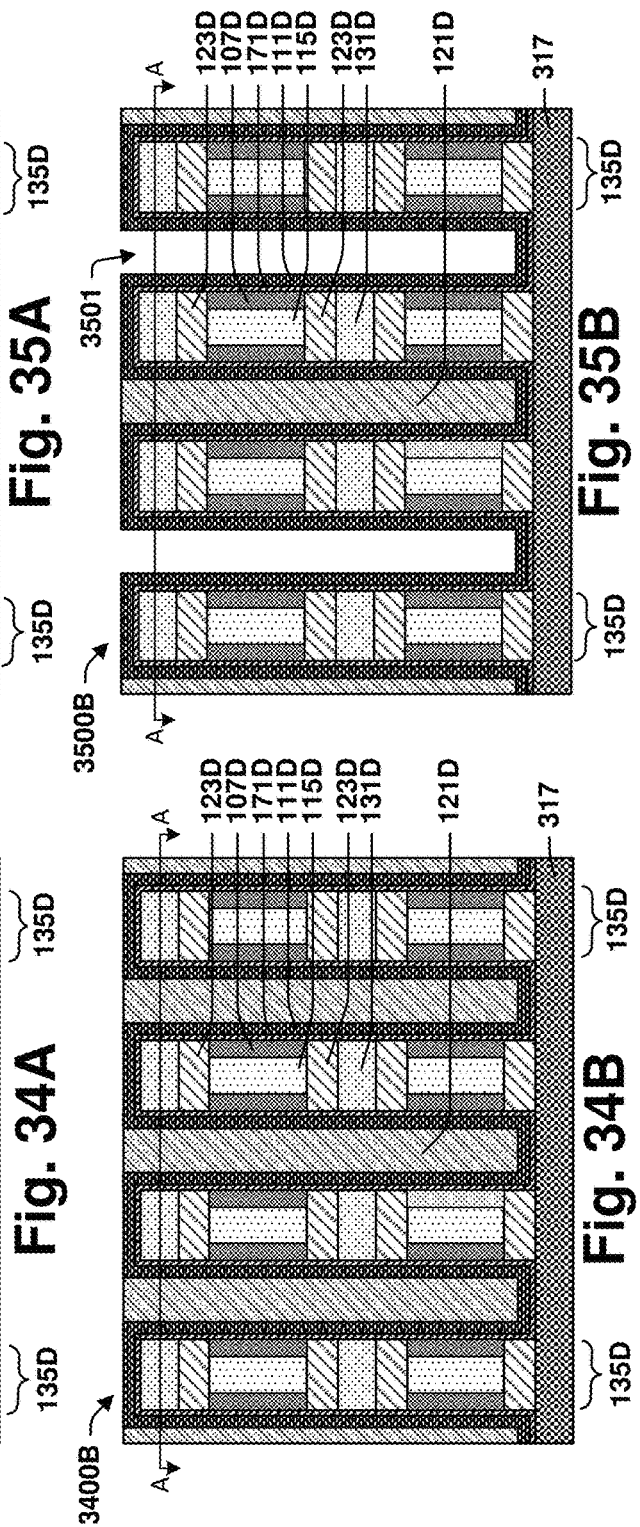

3D MEMORY WITH GRAPHITE CONDUCTIVE STRIPS

REFERENCE TO RELATED APPLICATION

This Application claims the benefit of U.S. Provisional Application No. 63/031,025, filed on May 28, 2020, the contents of which are incorporated herein by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B illustrates a vertical cross-section of the 3D memory array of FIG. 1A in the plane B.

FIG. 1C illustrates a horizontal cross-section of the 3D memory array of FIG. 1A in the plane C.

FIGS. 7A-7B illustrate vertical and horizontal cross-sections of a fourth 3D memory array, which is a 3D memory array according to some other aspects of the present teachings FIGS. 8A and 8B through FIGS. 14A and 14B are a series of paired top view and cross-sectional view illustrations exemplifying a method according to the present teachings of forming a device comprising a 3D memory array with features of the first 3D memory array.

FIGS. 15A and 15B through FIGS. 21A and 21B are a series of paired top view and cross-sectional view illustrations exemplifying a method according to the present teachings of forming a device comprising a 3D memory array with features of the second 3D memory array.

FIGS. 30A and 30B through FIGS. 35A and 35B are a series of paired cut-away top views and cross-sectional views exemplifying a method according to the present teachings of forming a device comprising a 3D memory array with features of the fourth 3D memory array.

DETAILED DESCRIPTION

Figure 1A:
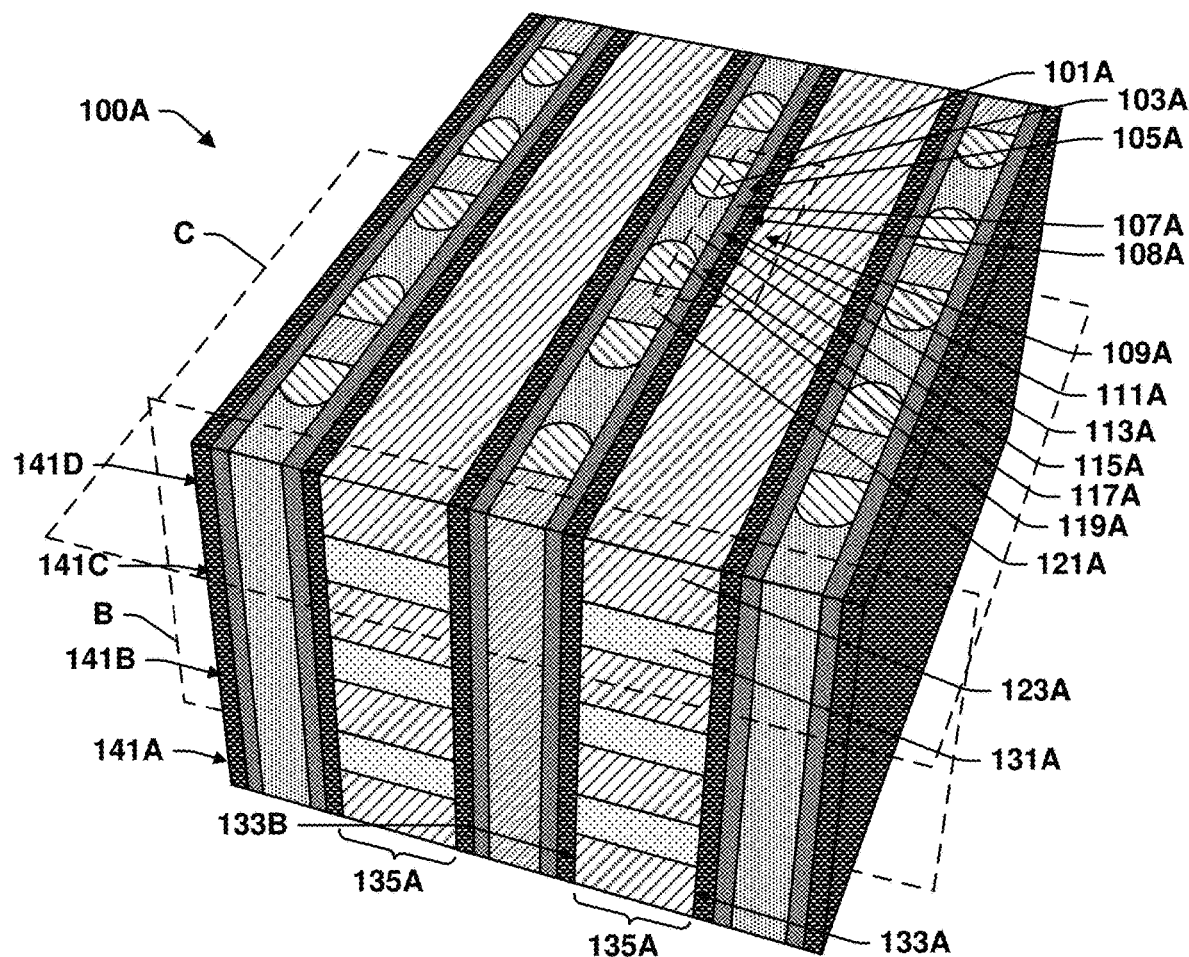
FIG. 1A illustrates a perspective view of a first 3D memory array, which is a 3D memory array according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A process of forming a three-dimensional (3D) memory array includes forming a stack having a plurality of conductive layers separated by dielectric layers. Etching trenches in the stack divides the conductive layers into conductive strips. The resulting structure includes a two-dimensional array of horizontal conductive strips. Memory cells may be distributed along the length of each strip to provide a 3D array. The conductive strips together with additional conductive structures that may have a vertical or horizontal orientation allow the memory cells to be addressed individually.

According to the present teachings, the conductive layers are formed of graphite or a like carbon-based material. When the conductive layers are graphite, the trenches are more easily etched to a high aspect ratio as compared to when the conductive layers are formed of a different conductive material such as a metal. Accordingly, forming the conductive layers of graphite enables the memory array to have more layers and a higher area density. A resulting 3-D memory array has conductive strips of graphite.

Some aspects of the present teachings relate to a three-dimensional array of memory cells of a type in which the memory cells have a source side, a drain side, a channel extending between the source side and the drain side, a control gate, and a data storage film between the control gate and the channel. Within the memory array is an array of stacks, each stack having conductive strips separated by dielectric strips. The conductive strips extend horizontally to connect with a plurality of the memory cells. In accordance with the present teachings, the conductive strips are formed with a carbon-based material. In some embodiments, the carbon-based material includes graphene. In some embodiments, the graphene is in the form of nanoribbons. In some embodiments, the graphene is boron-doped. In some embodiments, the carbon-based material includes nanocrystalline graphite.

The memory may have any suitable architecture. The architecture may be vertical, horizontal, crossbar, the like, or any combination thereof. In some embodiments, the conductive strips are horizontal gate strips. In some embodiments, additional conductors extend vertically through the array. These conductors may be formed of metal.

In some embodiments, recesses are formed in the sides of the stacks adjacent the conductive strips. A data storage film may be disposed in these recesses. Forming the data storage film within these recesses facilitates making the data storage film discontinuous between vertically adjacent memory cells in the array. The etch susceptibility of carbon-based materials facilitates the formation of these recesses.

Some aspects of the present teachings relate to a memory device having a plurality of stacks, each stack comprising two or more vertically stacked gate strips separated by dielectric strips. Source lines and drain lines are positioned between the stacks and extend along a stacking direction of the stacks. Memory cells in the array each have a channel extending between one of the source lines and one of the drain lines and a data storage structure positioned between the channel and one of the gate strips. The gate strips include graphite. In some embodiments, the graphite is graphene.

Some aspects of the present teachings relate to a method of forming a memory device. The method includes forming a broad stack comprising a plurality of conductive layers and a plurality of dielectric layers, etching trenches in the broad stacks to form a plurality of narrow stacks, and depositing a data storage film in the trenches. The conductive layers are a carbon-based material, which facilitates the etching process.

Some aspects of the present teachings relate to a method of forming a memory device. The method includes forming a broad stack comprising a plurality of dummy layers and a plurality of dielectric layers. A first set of trenches is formed in the stack. A first dummy etch is carried out in the first set of trenches. The first dummy etch may remove about half of each dummy layer. A first deposition process is carried out to replace the portion of the dummy layer removed by the first dummy etch with a carbon-based material. In some embodiments, the carbon-based material comprises graphene sheets. A second set of trenches are formed in the stack. A second dummy etch is carried out in the second set of trenches. The second dummy etch may remove a remaining portion of the dummy layers. A second deposition process is carried out to replace the portion of the dummy layer removed by the second dummy etch with the carbon-based material. By this method, the carbon-based material for the conductive strips may deposited using as few as two deposition steps regardless of the number of conductive strips in each stack.

FIG. 1A illustrates a perspective view of a first 3D memory array 100A of memory cells 101A according to some aspects of the present teachings. FIG. 2B illustrates a cross-section of the first 3D memory array 100A along a plane B of FIG. 1A. FIG. 2C illustrates a cross-section along a plane C of FIG. 1A. The line BC in FIGS. 2B and 2C is at the intersection of plane B and plane C. The plane B is vertical. The plane C is horizontal.

A row of stacks 135A is included within the first 3D memory array 100A. Each of the stacks 135A has gate strips 123A in a plurality of tiers 141A-141D separated by dielectric strips 131A. This example shows four tiers 141A-141D, but the stacks 135A may have a greater or lesser number of tiers. Data storage structures 108A and channel layers 107A are formed on a first side 133A and on a second side 133B of each stack 135A. The data storage structures 108A include at least a data storage film 111A. Source/drain connections, which include source lines 103A and drain lines 119A, are oriented vertically and disposed between the stacks 135A.

The memory cells 101A are arrayed horizontally and vertically on each of the first sides 133A and the second sides 133B of the stacks 135A. The horizontal positioning of the memory cells 101A may vary from side-to-side to provide staggering between the memory cells 101A on the first side 133A and the memory cells 101A on the second side 133B, but the arrangement of the memory cells 101A is repeated from tier to tier.

Each of the memory cells 101A includes a control gate 109A, a data storage structure 108A, a channel 113A, a source side 105A, and a drain side 117A. The control gates 109A are provided by the gate strips 123A. A single gate strip 123A may provide control gates 109A for a plurality of memory cells 101A including memory cells 101A that are horizontally adjacent along a length of a gate strip 123A and memory cells 101A that are on opposite sides 133A-B of the gate strip 123A. The channel 113A, the source side 105A, and the drain side 117A are all provided by portions of the channel layer 107A. The source side 105A is a portion of the channel layer 107A adjacent a source line 103A. The drain side 117A is a portion of the channel layer 107A adjacent a drain line 119A. The channel 113A is a portion of the channel layer 107A between the source side 105A and the drain side 117A.

The channel layer 107A extends vertically through the tiers 141A-141D to provide channels 113A, source sides 105A, and drain sides 117A for multiple memory cells 101A. Likewise, the data storage structure 108A may include a data storage film 111A that is continuous across all the memory cells 101A on the first side 133A or the second side 133B of a stack 135A. In some embodiments, the channel layer 107A is continuous across a length and a height of a stack 135A. Portions of the channel layer 107A may provide the channels 113A, the source sides 105A, and the drain sides 117A for all the horizontally and vertically distributed memory cells 101A on either the first side 133A or the second side 133B of a stack 135A.

Figure 2:
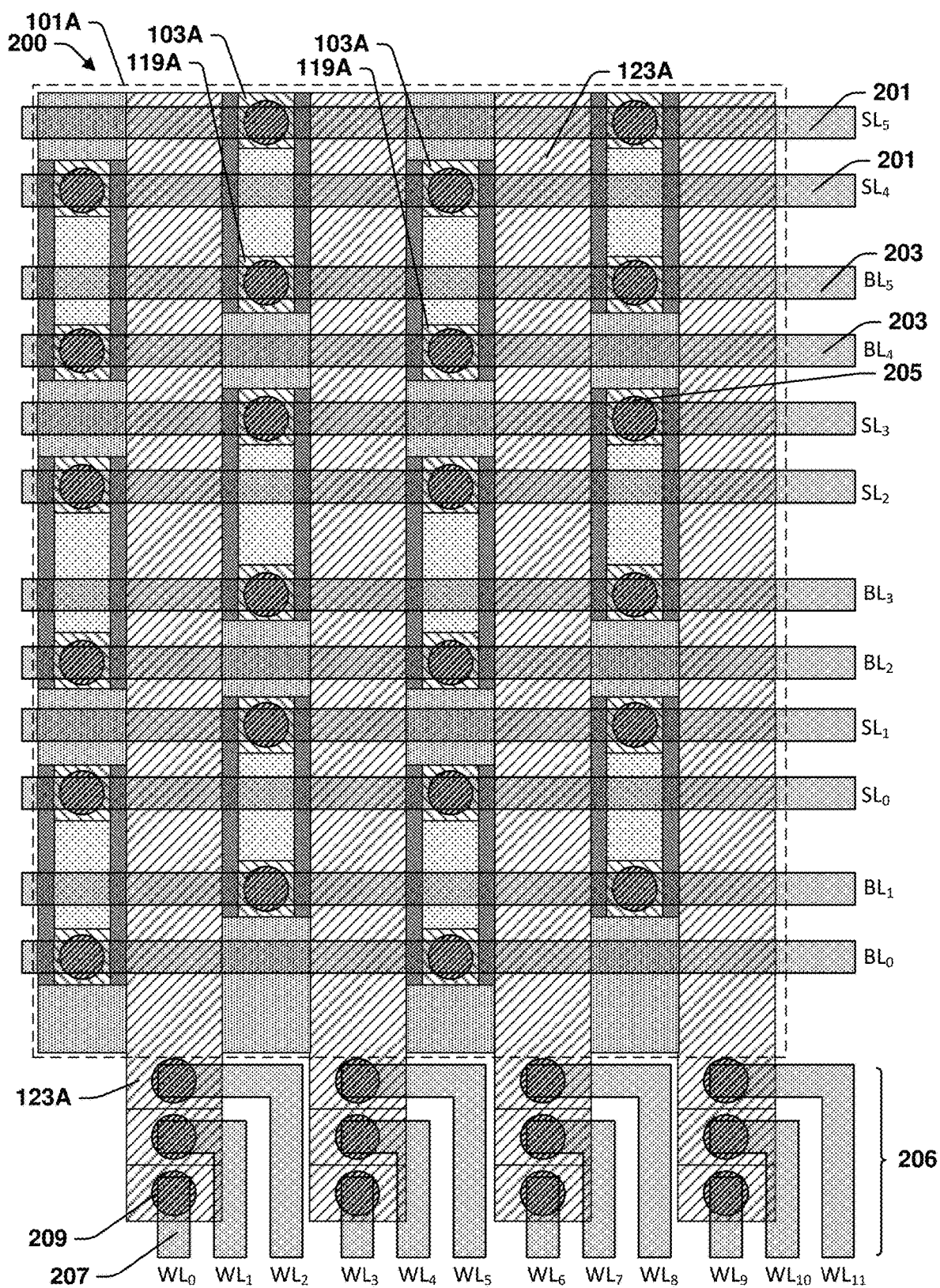
FIG. 2 is a top view illustrating an integrated circuit with the 3D memory array of FIG. 1A.
Figure 3:
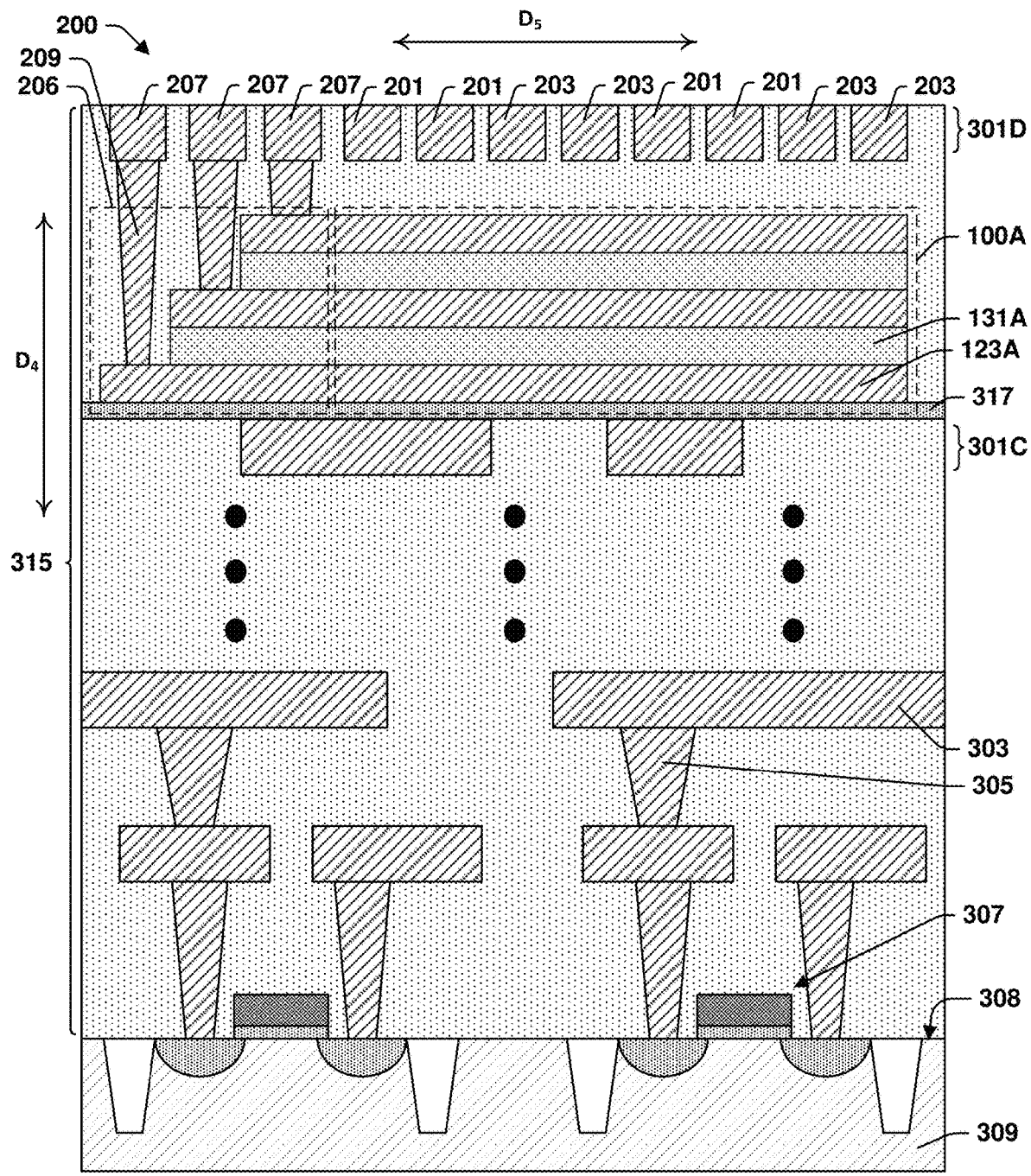
FIG. 3 illustrates a cross-section of an integrated circuit that includes the 3D memory array of FIG. 1A.

FIG. 2 illustrates a top view of the first 3D memory array 100A in an integrated circuit 200. FIG. 3 illustrates a partial cross-sectional view of the integrated circuit 200. As shown in these figures, the gate strips 123A may extend beyond one end of the first 3D memory array 100A to progressively varying lengths forming a staircase pattern 206 that allows each of the gate strips 123A to be coupled to a distinct word line wire 207 in an overlying metal interconnect layer 301D through vias 209. Source line wires 201 and bit line wires 203 may also be formed in the metal interconnect layer 301D. The source line wires 201 and the bit line wires 203 may extend crosswise with respect to the gate strips 123A and the stacks 135A. Each of the source line wires 201 may be coupled to a plurality of the source lines 103A through vias 205. Each of the bit line wires 203 may be coupled to a plurality of the drain lines 119A.

Figure 4:
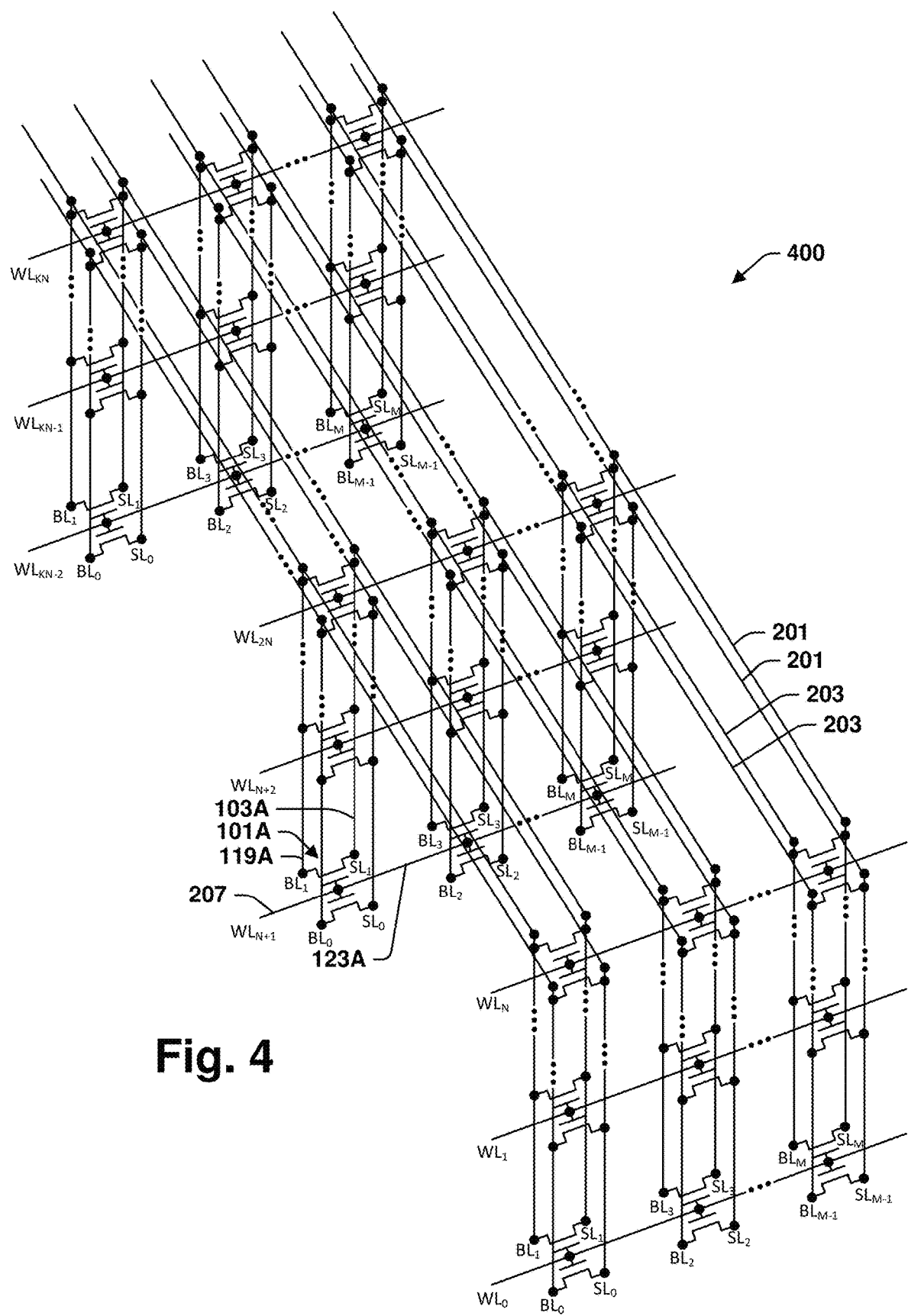
FIG. 4 provides an equivalent circuit diagram for the 3D memory array of FIG. 1A.

FIG. 4 provides an equivalent circuit diagram 400 for the first 3D memory array 100A. As illustrated by the equivalent circuit diagram 400, each of the memory cells 101A may operate as a transistor. There are M memory cells arranged along each of the gate strips 123A. There are K stacks 135A each having N tiers 141A-141D giving a total of K*N gate strips 123A. Each of the memory cells 101A may be individually addressed by selecting a corresponding word line wire 207, bit line wire 203, and source line wire 201. The numbers of gate strips 123A connected to each word line wire 207, the number of source lines 103A connected to each source line wire 201, and the number of drain lines 119A connected to each bit line wire 203 may be varied while preserving this feature.

Transistors have a threshold gate voltage at which a source to drain connection switches from open to closed. In a memory cell, that threshold may be varied through write and erase operations to provide two or more distinct threshold voltages. For example, the data storage structure may include a data storage film 111A that retains a polarization of electrical dipoles. An orientation of these dipoles may be varied to modulate a threshold voltage on the control gate 109A at which an electric field renders the channel 113A conductive. A first orientation of those electrical dipoles provides a first threshold voltage that may represent a logical "1" and a second orientation provides a second threshold voltage that may represent a logical "0".

In the first 3D memory array 100A, a write operation for one of the memory cells 101A may include setting a corresponding word line wire 207 to a programming voltage $V_{th}$ while a corresponding bit line wire 203 and a corresponding source line wire 201 are coupled to ground. The bit line wires 203 and the source line wires 201 of non-selected cells may be left floating or set to a voltage such as ½ $V_{dd}$. $V_{th}$ may be the highest possible threshold voltage for the memory cells 101A. For an erase operation, the corresponding word line wire 207 may be set to $-V_{th}$ while grounding the corresponding bit line wire 203 and the corresponding source line wire 201 and holding the other bit line wires 203 and source line wires 201 at $-½ V_{dd}$ or leaving them to float. A read operation may include setting the word line wire 207 to a voltage intermediate between the first threshold voltage and the second threshold voltage, for example ½ $V_{th}$, setting the source line wire 201 to $V_{dd}$, setting the bit line wire 203 to ground, and determining whether a resulting current is above or below a threshold.

FIGS. 2-4 show one way in which the memory cells 101A in the first 3D memory array 100A may be coupled within an integrated circuit 200 to enable read, write, and erase operations. Any other suitable coupling may be used including alternate couplings that cause variations in the numbers of source lines 103A, drain lines 119A, and gate strips 123A that are connected to each source line wire 201, bit line wire 203, and word line wire 207 respectively. FIGS. 2-3 show all the connections being made through vias 209 and vias 205 that connect to source line wires 201, bit line wires 203, and word line wires 207 disposed in the metal interconnect layer 301D above the first 3D memory array 100A, but some or all of these connections may be made to wires in a metal interconnect layer 301C below the first 3D memory array 100A. Using both the metal interconnect layer 301C and the metal interconnect layer 301D to make these connections may enable reductions in parasitic resistances and capacitances.

As shown in FIG. 3, the first 3D memory array 100A may be disposed between the metal interconnect layer 301C and the metal interconnect layer 301D within a metal interconnect structure 315 over a substrate 309. The metal interconnect layer 301C and the metal interconnect layer 301D may be the $3^{rd}$ and $4^{th}$ metal interconnect layers, the $4^{th}$ and $5^{th}$ metal interconnect layers, or any other adjacent pair of metal interconnect layers in the metal interconnect structure 315. The substrate 309 may be a semiconductor substrate and may support field effect transistors (FETs) 307 and other devices used to operate the first 3D memory array 100A. These devices may be connected to the first 3D memory array 100A through wires 303 and vias 305 within the metal interconnect structure 315.

The substrate 309 may be a die cut from a wafer, such as a silicon wafer or the like. The substrate 309 may be a semiconductor substrate, such as a bulk semiconductor, a semiconductor-on-insulator (SOI) substrate, or the like. Other substrates, such as a multilayered or gradient substrate may also be used. In some embodiments, the semiconductor material of the substrate 309 is or includes silicon, germanium, silicon carbide, gallium arsenide, gallium phosphide, indium phosphide, indium arsenide, and/or indium antimonide, silicon germanium, gallium arsenide phosphide, aluminum indium arsenide, aluminum gallium arsenide, gallium indium arsenide, gallium indium phosphide, gallium indium arsenide phosphide, combinations thereof, or the like. The substrate 309 may be or include a dielectric material. For example, the substrate 309 may be a dielectric substrate or may include a dielectric layer on a semiconductor substrate. The dielectric material may be an oxide such as silicon oxide, a nitride such as silicon nitride, a carbide such as silicon carbide, combinations thereof such as silicon oxynitride, silicon oxycarbide, silicon carbonitride, the like, or any other suitable dielectric.

With reference to FIG. 3, the substrate 309 has a major surface 308. A direction $D_4$ is perpendicular to the major surface 308. The direction $D_4$ is the one referred to herein as the vertical direction and is also as a stacking direction for the stacks 135A. A direction $D_5$ is perpendicular to the direction $D_4$, is parallel to the major surface 308, is a direction along which the gate strips 123A extend, and is referred to herein as a horizontal direction.

In the examples of this disclosure, the memory cells are of a type that has the structure of a transistor, although the concepts of the present disclosure are useful for 3D memory arrays with any type of memory cell. In some embodiments, the memory cells 101A are ferroelectric memory cells and the data storage film 111A is or comprises a ferroelectric material that contains electrical dipoles and retains polarization of those dipoles. Examples of ferroelectric materials that may be suitable include hafnium zirconium oxide (HfZrO), hafnium aluminum oxide (HfAlO), hafnium lanthanum oxide (HfLaO), hafnium zirconium oxide (HfZrO), hafnium cerium oxide (HfCeO), hafnium oxide (HfO), hafnium silicon oxide (HfSiO), hafnium gadolinium oxide (HFGdO), or the like. In some embodiments, the ferroelectric material is a doped hafnium oxide. In some embodiments, the doped hafnium oxide is in the orthorhombic phase. In some embodiments, the dopant is present in an atomic percentage of 50% or less.

In some embodiments, a thickness of the data storage film 111A is in a range from about 5 nanometers to about 20 nanometers. In some embodiments, the thickness is from about 5 to about 10 nanometers. In some embodiments, the thickness is from about 10 to about 15 nanometers. If the data storage film 111A is a ferroelectric material and the thickness is too small (e.g., less than about 5 nanometer), polarization may not be well retained and reliability may be low. If the thickness is too large (e.g., greater than about 20 nanometers), program and erase voltages may be large and adversely affect power efficiency.

If the memory cells 101A are ferroelectric memory cells, the data storage structure 108A may include a data storage film 111A that is continuous across a plurality of the memory cells 101A. In a ferroelectric memory cell, the data storage film 111A may store information locally without being electrically isolated from the data storage films of adjacent cells. The data storage structure 108A may further include a gate dielectric layer (not shown) between the data storage film 111A and the channel 113A. The gate dielectric layer may be deposited as a separate layer or may be allowed to form spontaneously by a reaction such as a reaction between the data storage film 111A and the channel layer 107A. The gate dielectric layer may be of any suitable material. For example, the gate dielectric layer may be or include silicon oxide (e.g., $SiO_2$), aluminum oxide (e.g., $Al_2O_3$), silicon oxynitride (e.g., SiON), silicon nitride (e.g., $Si_3N_4$), lanthanum oxide (e.g., $La_2O_3$), strontium titanium oxide (e.g., $SrTiO_3$), undoped hafnium oxide (e.g., $HfO_2$), a combination thereof, or the like. In some embodiments, the gate dielectric layer is or includes a high k dielectric, which is a material having a dielectric constant greater than about 3.9. In various embodiments, the gate dielectric layer has a dielectric constant of about 3.9-15, about 3.9-10, or about 10-15.

In some embodiments, a thickness of the gate dielectric layer is less than about 2.5 nanometers. In some embodiments, the thickness is from about 1.5 to about 2.5 nanometers. In some embodiments, the thickness is from about 1.5 to about 1.8 nanometers. In some embodiments, the thickness is from about 1.7 to about 2.5 nanometers. If the thickness is too small (e.g., about 1 nanometer or less), data retention may be low. If the thickness is too great (e.g., greater than about 2.5 nanometers), the program and erase voltages may be too large or the memory window (i.e., a difference between the high and low threshold voltages) may be too small. High program and erase voltages reduce power efficiency. A small memory window reduces reliability.

The channel layer 107A may be or include a semiconductor. In some embodiments, the channel layer 107A is or includes an oxide semiconductor. Oxide semiconductors that may be suitable for the channel layer 107A include, without limitation, zinc oxide (ZnO), indium tungsten oxide (InWO), indium gallium zinc oxide (InGaZnO), indium zinc oxide (InZnO), indium gallium zinc tin oxide (InGaZnSnO or IGZTO), indium tin oxide (InSnO or ITO), combinations thereof, or the like. In some embodiments, the channel layer 107A is or includes polysilicon, amorphous silicon, or the like. In some embodiments, the channel layer has a thickness from about 2 nm to about 30 nm. In some embodiments, the channel layer has a thickness from about 2 nm to about 10 nm. In some embodiments, the channel layer has a thickness from about 5 nm to about 20 nm.

In some embodiments, the memory cells 101A are floating gate memory cells and the data storage structure 108A is a charge storage structure. In these embodiments, programming involves storing or removing a charge from a data storage film 111A between two dielectric layers. Each of the two dielectric layers may be an oxide such as silicon oxide, a nitride such as silicon nitride, a carbide such as silicon carbide, combinations thereof such as silicon oxynitride, silicon oxycarbide, silicon carbonitride, or the like. The data storage film 111A may also be a dielectric of one of these types or some other type. For example, the data storage structure 108A may be an ONO structure in which a the data storage structure 108A is a nitride layer and is sandwiched between two oxide layers.

The gate strips 123A are conductive structures formed of carbon-based material. The material may be graphite. Graphene is a form of graphite. In some embodiments, the carbon-based material includes graphene. In some embodiments, the graphene is in the form of nanoribbons. In some embodiments, the graphene is boron-doped. In some embodiments, the carbon-based material includes nanocrystalline graphite.

In some embodiments, the gate strips 123A comprise graphene sheets. In some embodiments, the graphene sheets have a horizontal orientation. In some embodiments, the graphene sheets have a vertical orientation in a central area of a gate strip 123A and transition to horizontal orientations adjacent underlying and overlying gate strips 123A providing an overall C-shaped structure. This structure results from the gate strip 123A being formed by a replacement gate process described below.

The source lines 103A and the drain lines 119A may be formed of any suitable conductive material. Suitable conductive materials for the source lines 103A and the drain lines 119A may include doped polysilicon, metals, and the like. In some embodiments, the conductive material includes a metal. Forming the source lines 103A and the drain lines 119A of metal may provide a compact design with low parasitic resistance. Some examples of metals that may be used are tungsten (W), copper (Cu), ruthenium (Ru), molybdenum (Mo), cobalt (Co), aluminum (Al), nickel (Ni), silver (Ag), gold (Au) the like, and alloys thereof. In some embodiments, the source lines 103A and the drain lines 119A further include a diffusion barrier layer, a glue layer, or other such layer. Some examples of materials that may be used for a diffusion barrier layer or a glue layer are titanium nitride (TiN), tantalum nitride (TaN), molybdenum nitride (MoN), zirconium nitride (ZrN), hafnium nitride (HfN), and the like.

An intracell dielectric 115A provides fill and insulation between the source lines 103A and the drain lines 119A corresponding to individual memory cells 101A. Intercell dielectric plugs 121A provides fill and insulation between the source lines 103A and the drain lines 119A of horizontally adjacent memory cells 101A. The intracell dielectric 115A, the intercell dielectric plugs 121A, and the dielectric strips 131A may each be any suitable dielectric. Suitable dielectrics for these structures may be, for example, oxides such as silicon oxide, nitrides such as silicon nitride, carbides such as silicon carbide, combinations thereof such as silicon oxynitride, silicon oxycarbide, silicon carbonitride, or the like. Distinct dielectrics may be selected for the intracell dielectric 115A and the intercell dielectric plugs 121A in order to provide etch selectivity that facilitates manufacturing.

In some embodiments, a height $H_1$ of the dielectric strips 131A and a height $H_2$ of the gate strips 123A are each in a range from about 15 nm to about 90 nm. In some embodiments, the height $H_1$ is in a range from about 15 nm to about 45 nm. In some embodiments, the height $H_1$ is in a range from about 45 nm to about 90 nm. In some embodiments, the height $H_2$ is in the range from about 15 nm to about 30 nm. In some embodiments, the height $H_2$ is in the range from about 30 nm to about 60 nm. In some embodiments, the height $H_1$ is greater than the height $H_2$. In some embodiments, the height $H_2$ is greater than the height $H_1$. In some embodiments, the height $H_1$ is within a factor of three of the height $H_2$. In some embodiments, the height $H_1$ is within a factor of two of the height $H_2$.

A width $W_2$ of the dielectric strips 131A is also a width of the stacks 135A. In some embodiments, the width $W_2$ is in a range from about 20 nm to about 200 nm. In some embodiments, the width $W_2$ is in a range from about 30 nm to about 160 nm. In some embodiments, a distance $D_2$ between adjacent stacks 135A is from about 30 nm to about 200 nm. In some embodiments the distance $D_2$ is from about 40 nm to about 140 nm.

The source lines 103A and the drain lines 119A may be of similar sizes to one another. In some embodiments, a width $W_1$ and a length $L_2$ of the source lines 103A and the drain lines 119A are each in a range from about 20 nm to about 100 nm. In some embodiments, the width $W_1$ and the length $L_2$ are each in a range from about 30 nm to about 80 nm. In some embodiments, cross-sectional areas of the source lines 103A and the drain lines 119A in the horizontal plane are in a range from about 500 nm$^2$ to about 10,000 nm$^2$. In some embodiments, the areas are in a range from about 900 nm$^2$ to about 6,000 nm$^2$.

In some embodiments, a length $L_1$ of the channels 113A is in a range from about 30 nm to about 200 nm. In some embodiments, the length $L_1$ is in a range from about 60 nm to about 150 nm. Due to the bulges 106A, a distance $D_1$ between the source line 103A and the drain line 119A is less than the channel length $L_1$. The channel length $L_1$ may be a distance from a point at which the channel layer 107A abuts the source line 103A to a point at which the channel layer 107A abuts the drain line 119A. In some embodiments, the distance $D_1$ is 90% or less of the length $L_1$. In some embodiments, the distance $D_1$ is 80% or less of the length $L_1$. In some embodiments, the distance $D_1$ is 70% or less of the length $L_1$. In some embodiments, areas of the source line 103A and the drain line 119A are 5% or more greater than they would be absent the bulges 106A. In some embodiments, areas of the source line 103A and the drain line 119A are 10% or more greater than they would be absent the bulges 106A. In some embodiments, areas of the source line 103A and the drain line 119A are 20% or more greater than they would be absent the bulges 106A.

In some embodiments, a spacing $S_1$ between adjacent memory cells 101A within a tier 141A-D is in a range from about 30 nm to about 200 nm. In some embodiments, the spacing $S_1$ is in a range from about 30 nm to about 100 nm. In some embodiments, the spacing $S_1$ is in a range from about 60 nm to about 200 nm. In some embodiments, the spacing $S_1$ between horizontally adjacent memory cells 101A in a given tier 141A-D is greater than the height $H_1$, which is the spacing between vertically adjacent memory cells 101A.

Figure 5B:
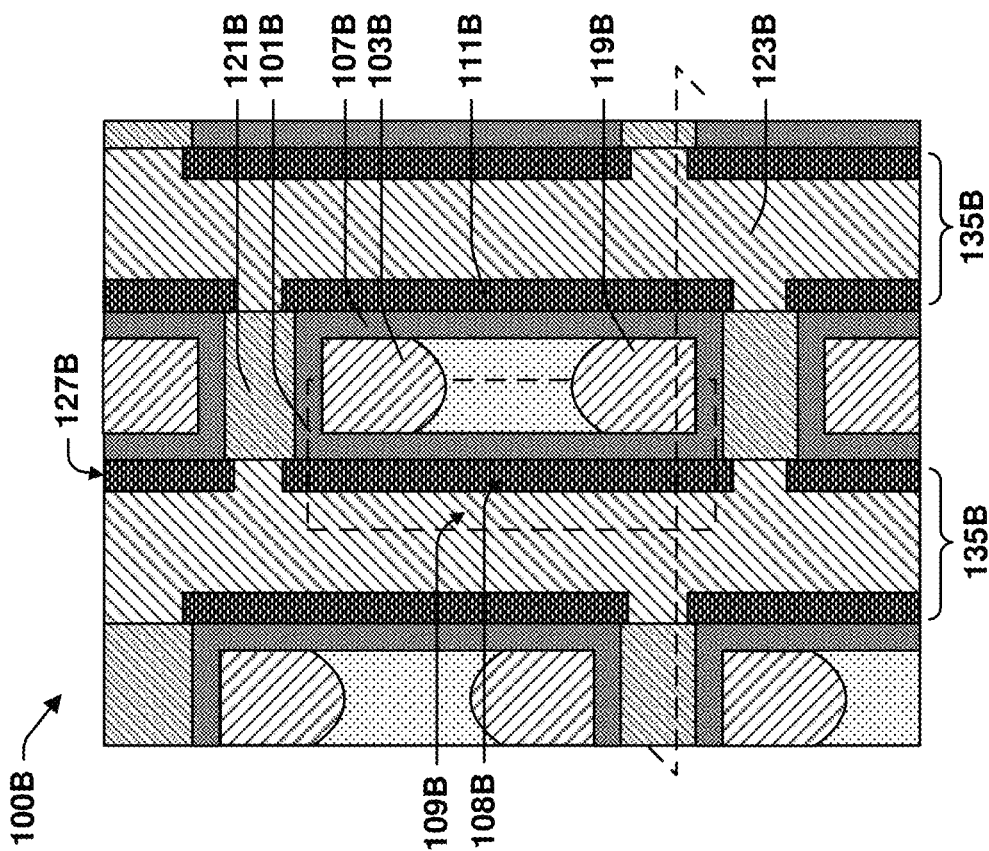
FIGS. 5A-5C illustrate vertical and horizontal cross-sections of a second 3D memory array, which is a 3D memory array according to some other aspects of the present teachings
Figure 5A:
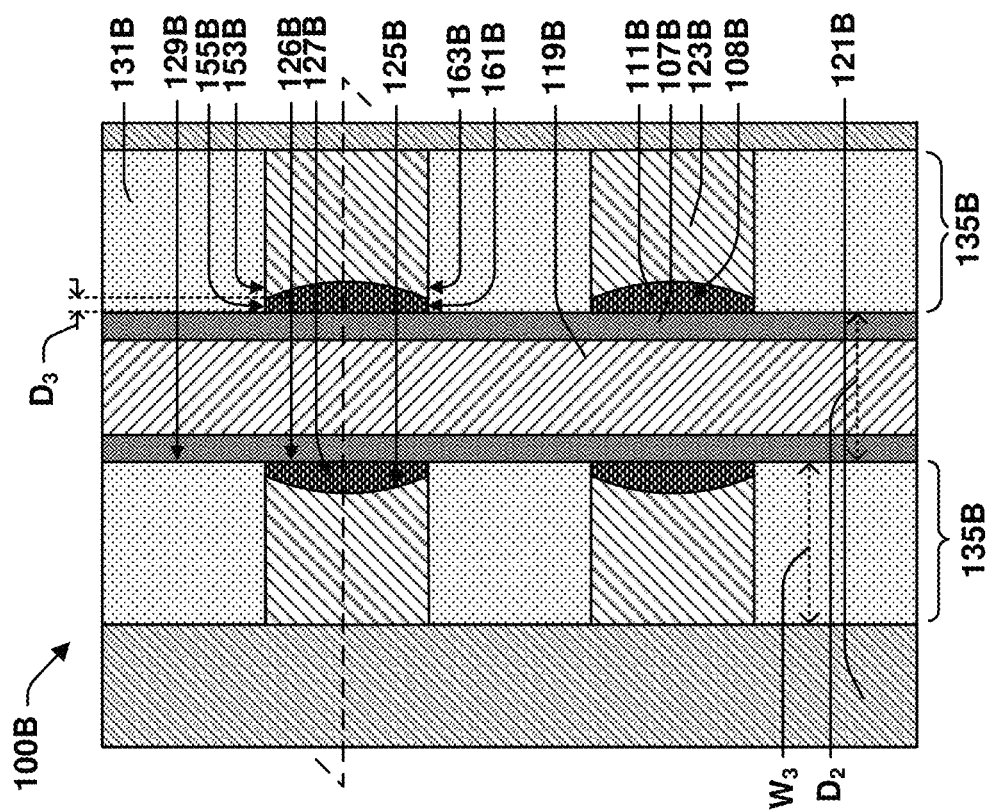
Figure 5C:
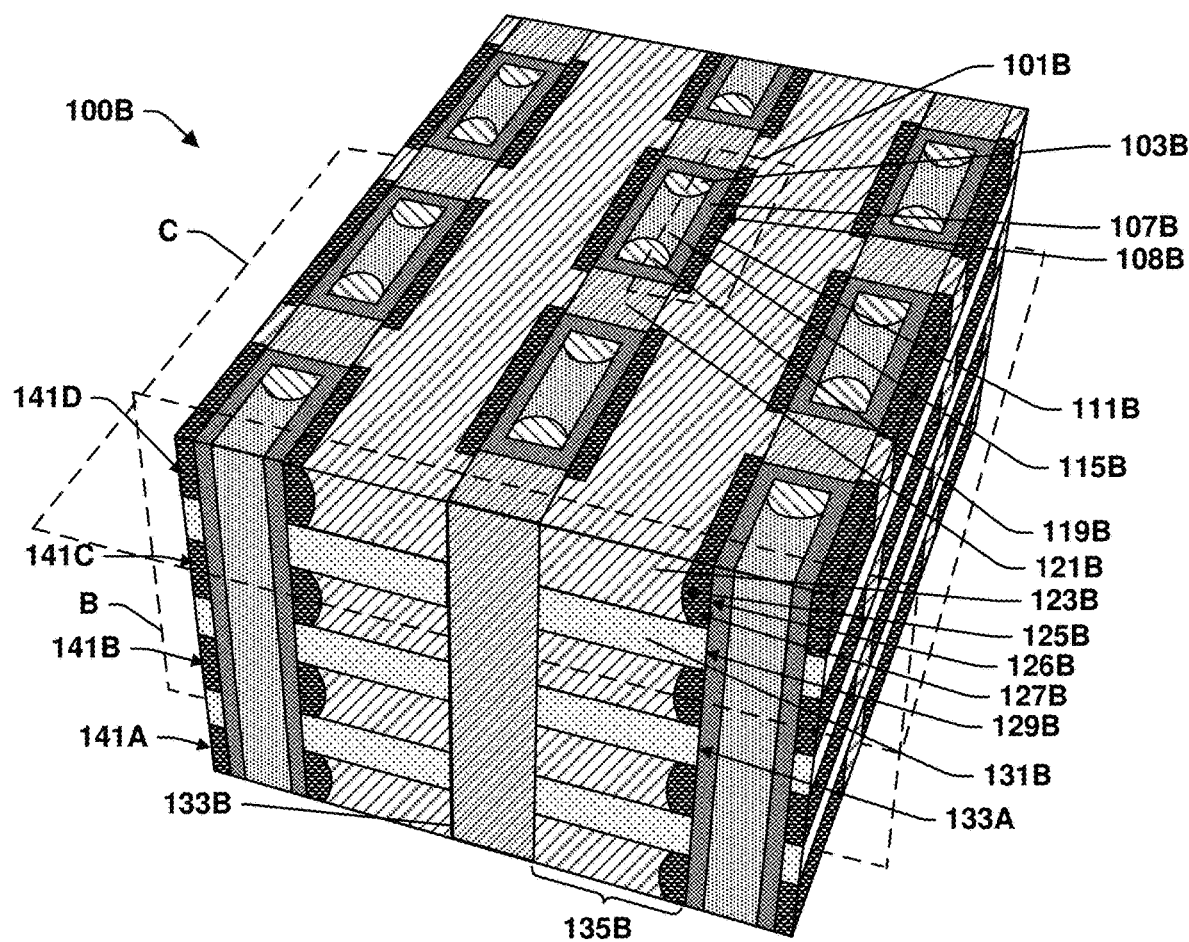

FIGS. 5A and 5B illustrate cross-sections of a second 3D memory array 100B. FIG. 5C provides a perspective view of the second 3D memory array 100B. The second 3D memory array 100B has memory cells 101B and is generally similar to the first 3D memory array 100A and has corresponding features except for the differences noted below. One such difference is that in the second 3D memory array 100B the data storage films 111B are disposed within recesses 127B in the stacks 135B. This structure makes the data storage films 111B discontinuous between the tiers 141A-141D. Another difference is that the dielectric plugs 121B extend across the distance $D_2$ between adjacent stacks 135B. The dielectric plugs 121B are formed before the recesses 127B, whereby the recesses 127B do not extend past the dielectric plugs 121B. This structure makes the data storage films 111B discontinuous between adjacent cells within each tiers 141A-141D.

There is one recess 127B for each of the memory cells 101B. The data storage films 111B are contained within the recesses 127B. As a consequence, the data storage films 111B are discontinuous between horizontally adjacent memory cells 101B, between vertically adjacent memory cells 101B, and between any pair of memory cells in the second 3D memory array 100B. Because the data storage films 111B are discontinuous, there are more options for the data storage structures 108B as compared to the data storage structures 108A. For example, the data storage structures 108B may be floating gates with conductive data storage films 111B on which charge may be stored to vary a threshold voltage for the control gate 109B. The data storage structure 108B may include insulating films between the data storage film 111B and each of the channel layer 107B and the control gate 109B.

The dielectric strips 131B have dielectric sidewalls 129B. The gate strips 123B have gate sidewalls 125B that are indented relative to the dielectric sidewalls 129B to create the recesses 127B in the stacks 135B. The recesses 127B are regions inward from the dielectric sidewalls 129B in a cross-section extending along a vertical direction, which is a stacking direction of the stacks 135B. The gate sidewalls 125B may be concave and indented relative to the dielectric sidewalls 129B by a distance $D_1$. The source lines 103B and the drain lines 119B are oriented vertically and disposed between the stacks 135B.

The data storage films 111B may fill the recesses 127B. The data storage films 111B have an upper surface 155B and a lower surface 161B respectively horizontally aligned with an upper surface 153B and a lower surface 163B of an adjacent gate strip 123B. Within the tiers 141B-141C, the upper surface 153B and the upper surface 155B abut an overlying dielectric strip 131B. Within the tiers 141B-141D, the lower surface 161B and the lower surface 163B abut an underlying dielectric strip 131B. Sidewalls 126B of the data storage films 111B may be horizontally aligned with vertically adjacent dielectric sidewalls 129B.

A width $W_3$ of the dielectric strips 131B is also a width of the stacks 135B. In some embodiments, the width $W_3$ is in a range from about 30 nm to about 200 nm. In some embodiments, the width $W_3$ is in a range from about 40 nm to about 160 nm. The gate strips 123B may be narrower. At their narrowest, a width of the gate strips 123B may be the width $W_3$ less a thickness of the data storage film 111B. In some embodiments, the distance $D_1$ is in a range from about 2 nm to about 20 nm. In some embodiments, the distance $D_1$ is in a range from about 2 nm to 12 nm. In some embodiments, the distance $D_1$ is in a range from about 2 nm to about 6 nm.

The channel layer 107B is disposed on the dielectric sidewalls 129B as well as over the data storage structure 108B. In some embodiments like the one illustrated, the channel layer extends over the intercell dielectric plugs 121B as shown and is disposed between the intercell dielectric plugs 121B and the source lines 103A and the drain lines 119B. In some other embodiments, the channel layer 107B is formed before the intercell dielectric plugs 121B and is not disposed on the sides of the intercell dielectric plugs 121B.

In some embodiments, the channel layer 107B is disposed in the recesses 127B. The stacks 135B may be made wider and the recesses 127B may be made deeper to accommodate the channel layer 107B. In some embodiments, part of the channel layer 107B is disposed in the recesses 127B and part outside the recesses 127B. The data storage structure 108B may include layers in addition to the data storage film 111B, such as dielectric layers. In some embodiments, the data storage structure 108B together with all or a portion of the channel layer 107B fills the recesses 127B.

Figure 6B:
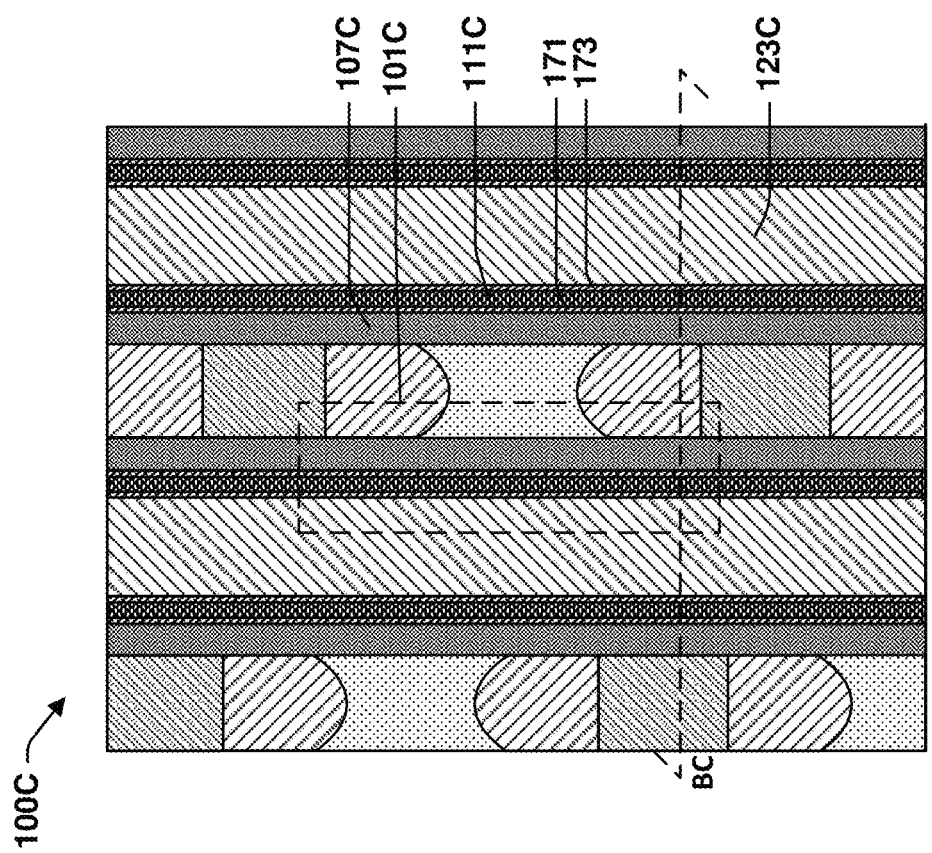
FIGS. 6A-6B illustrate vertical and horizontal cross-sections of a third 3D memory array, which is a 3D memory array according to some other aspects of the present teachings
Figure 6A:
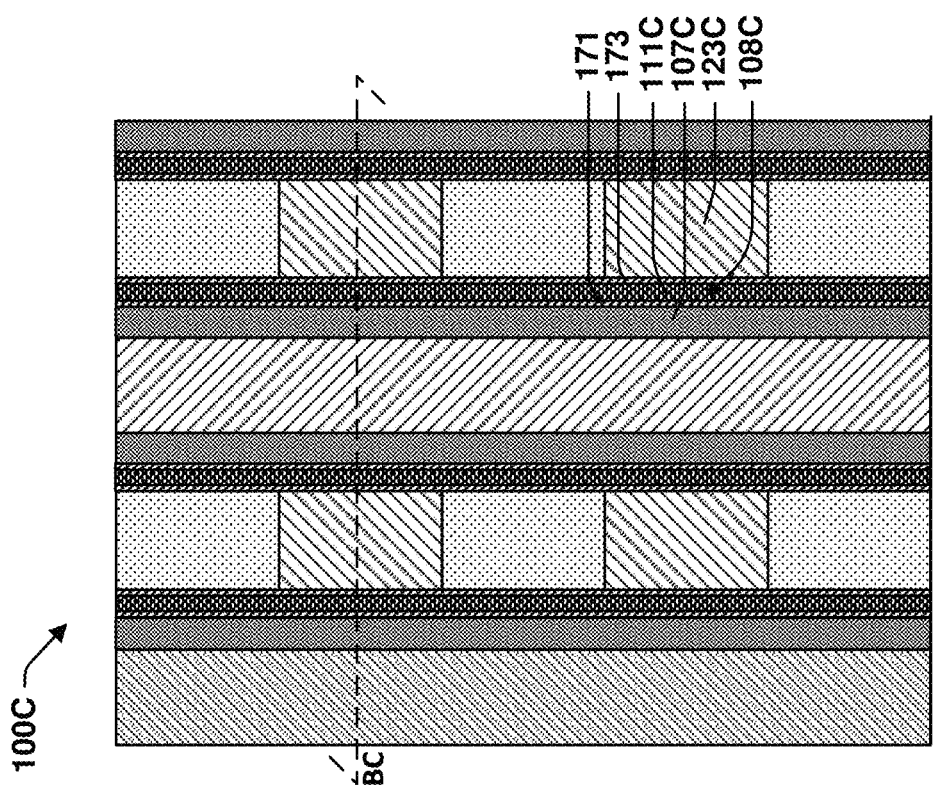

FIGS. 6A and 6B illustrate cross-sections of a third 3D memory array 100C according to some other aspects of the present teachings. The third 3D memory array 100C has memory cells 101C and has features corresponding to the first 3D memory array 100A. The third 3D memory array 100C has a dielectric layer 173 disposed between the data storage film 111C and the gate strips 123C and another dielectric layer 171 disposed between the data storage film 111C and the channel layer 107C. The data storage structure 108C may be, for example, an ONO data storage structure. In some embodiments, the dielectric layer 173 is disposed on the dielectric sidewalls 129C as well as over the data storage films 111C.

FIGS. 7A and 7B illustrate a fourth 3D memory array 100D according to some other aspects of the present teachings. FIG. 7B is a cross-section along the vertical direction. FIG. 7A is a cutaway top view, with the cutaway taken on a horizontal plane through the line A of FIG. 7B. The fourth 3D memory array 100D may use many of the same materials and layer thicknesses as the first 3D memory array 100A, but has a different structure and connectivity. Like the first 3D memory array 100A, the fourth 3D memory array 100D includes a row of stacks 135D, each stack having a plurality of horizontal conductive strips 123D of carbon-based material separated by dielectric strips. The dielectric strips include intercell dielectric strips 131D, which may be the intercell dielectric, and intracell dielectric strips 115D, which may be the intracell dielectric. The conductive strips 123D are operative as source lines and drain lines. Vertical conductive features 103D between the stacks 135D are operative as word lines. The vertical conductive features may have any suitable composition. In some embodiments, the vertical conductive features are metal. Forming the horizontal conductive features with carbon-based material facilitate manufacturing.

The fourth 3D memory array 100D includes memory cells 101D. Each of the memory cells 101D includes a channel 113D, a data storage structure 108D, and a control gates 109D. The channel 113D extends between a source side 105D that is adjacent a first conductive strips 123D and a drain side 117D that is adjacent a second conductive strips 123D. The channels 113D are provided by channel layers 107D disposed on the sides of the intracell dielectric strips 115D. The control gate 109D is a portion of a vertical conductive feature 103D. The data storage structure 108D comprises vertical films disposed between the channel 113D and the control gate 109D. The data storage structure 108D may include a portion of a data storage film 111D and may include additional layers, such as the dielectric layer 171D.

FIGS. 8A and 8B through FIGS. 14A and 14B are a series of paired top view and cross-sectional view illustrations exemplifying a method according to the present teachings of forming a device comprising a 3D memory array with features of the first 3D memory array 100A or the like. While FIGS. 8A and 8B through FIGS. 14A and 14B are described with reference to various embodiments of a method, it will be appreciated that the structures shown in FIGS. 8A and 8B through FIGS. 14A and 14B are not limited to the method but rather may stand alone separate from the method. While FIGS. 8A and 8B through FIGS. 14A and 14B are described as a series of acts, it will be appreciated that the order of the acts may be altered in other embodiments. While FIGS. 8A and 8B through FIGS. 14A and 14B illustrate and describe a specific set of acts, some acts that are illustrated and/or described may be omitted in other embodiments. Further, acts that are not illustrated and/or described may be included in other embodiments. While the method of FIGS. 8A and 8B through FIGS. 14A and 14B is described in terms of forming the first 3D memory array 100A, the method may be used to form other memory arrays.

Figure 8A:
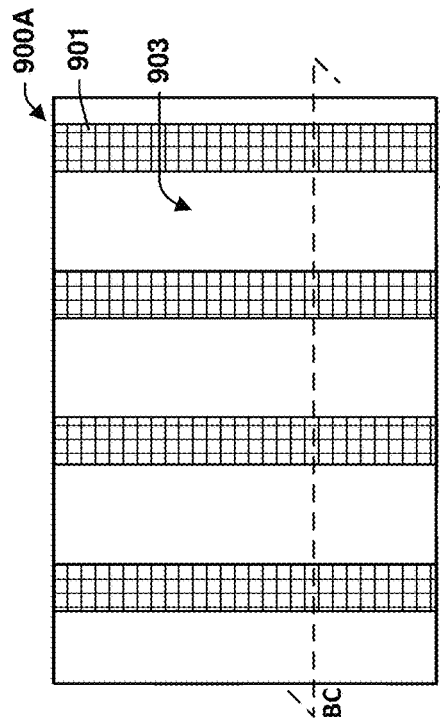
Figure 8B:
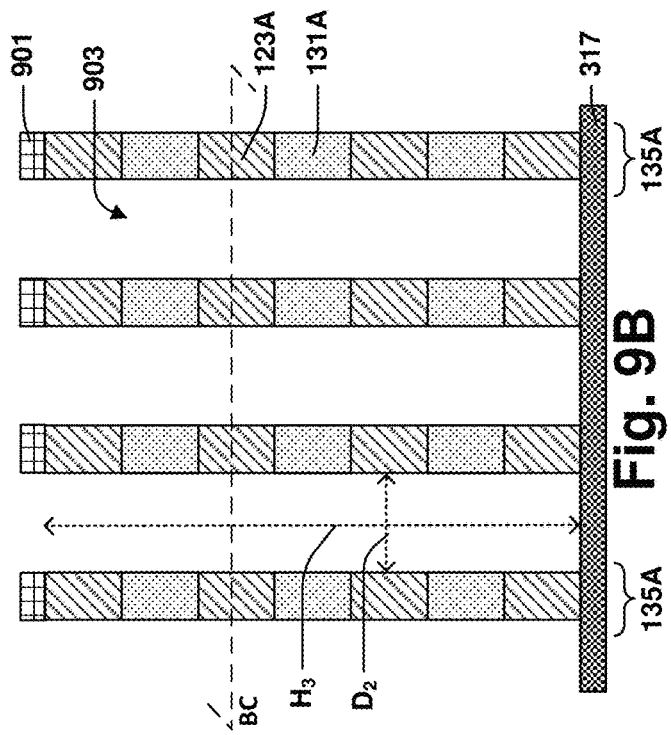

As shown by the top view 800A of FIG. 8A and the cross-sectional view 800B of FIG. 8B, the method begins with forming a broad stack 805 of alternating gate layers 801 and dielectric layers 803 over a dielectric layer 317. The dielectric layer 317 may be one or more layers formed over a metal interconnect layer 301C as shown in FIG. 3, but more generally could be the top layer of any suitable substrate. In the broad stack 805, the top and bottom layers are gate layers 801, but either could be a dielectric layer 803.

The dielectric layers 803 and the gate layers 801 may be formed by any suitable processes such as chemical vapor deposition (CVD), atomic layer deposition (ALD), or the like. In some embodiments, the gate layers 801 are dummy layers that are later replaced by carbon-based material to provide gate strips. In other embodiments, the gate layers 801 are carbon-based materials.

Plasma enhanced CVD may be suitable for depositing graphene and nano-crystalline graphite layers. A power level between 10 W and 500 W may be used to produce the plasma. The temperature may be elevated, but is generally kept below 400° C. The carbon source may be methane ($CH_4$) or the like. An inert gas such as argon (Ar) may be included in the feed gas mixture. In some embodiments, each of the gate layers 801 is formed over a time period in the range from about 5 minutes to about 10 hours. In some embodiments, each of the gate layers 801 is formed over a time period in the range from about 10 minutes to about 60 minutes. In some embodiments, each of the gate layers 801 is formed over a time period in the range from about 1 hour to about 10 hours.

Figure 9A:
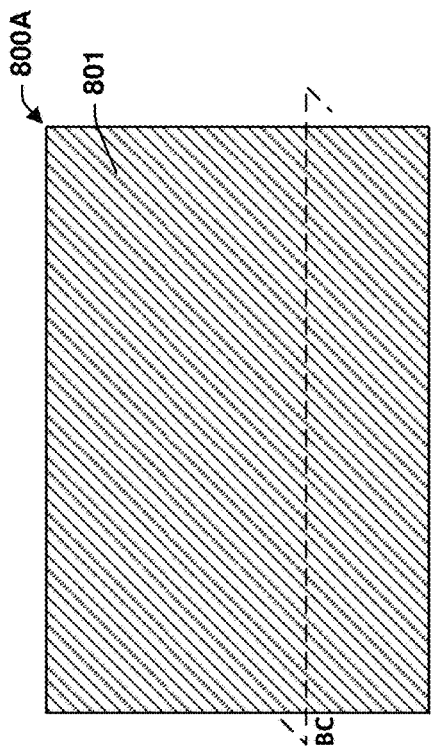
Figure 9B:
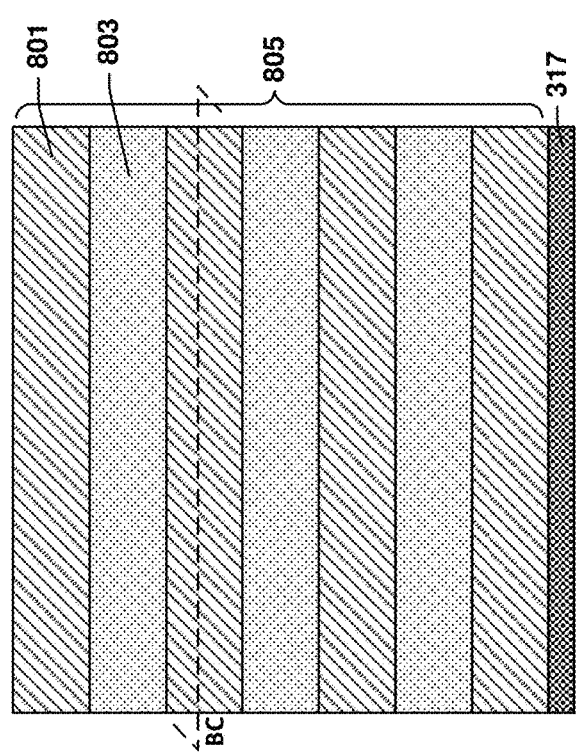

As shown by the top view 900A of FIG. 9A and the cross-sectional view 900B of FIG. 9B, a mask 901 may be formed and used to pattern trenches 903 that divide the broad stack 805 into a series of stacks 135A. The mask 901 may be a hard mask of any suitable material. The mask 901 may be formed by a CVD process, a spin-on process, the like, or any other suitable process. The mask 901 may be patterned by etching through a photoresist mask (not shown). The photoresist mask may be patterned using photolithography.

The stacks 135A may include gate strips 123A formed from the gate layers 801 and dielectric strips 131A formed from the dielectric layers 1203. A ratio of a height $H_3$ to a width $D_2$ is an aspect ratio of the trenches 903. In some embodiments, the aspect ratio is in a range from about 5 to about 15. Forming trenches 903 with an aspect ratio of less than about 5 may compromise the cell density of the first 3D memory array 100A. Forming trenches 903 with an aspect ratio greater than about 15 may cause twisting or collapsing of the stacks 135A during processing.

The etching may be accomplished with any suitable etch process or combination of etch processes. The etch processes may be anisotropic etch processes. In some embodiments, the etching includes a plasma etch. In some embodiments, the etch gases include an oxygen source. Oxygen may facilitate etching of a carbon-based material forming the gate layer 801. Argon may also be suitable.

As shown by the top view 1000A of FIG. 10A and the cross-sectional view 1000B of FIG. 10B, the layers a data storage structure 108A and a channel layer 107A may be deposited in the trenches 903 followed by filling with a dielectric such as the intracell dielectric 115A. The data storage structure 108A may include a data storage film 111A that forms continuous layers on each side of each stacks 135A. Additional layers may be deposited before or after the data storage film 111A if desired for the data storage structures 108A. The channel layers 107A may deposit conformally on the data storage structure 108A. In some embodiments, the data storage structures 108A are completed by a dielectric layer that forms during deposition of the channel layers 107A. The deposition processes may be CVD, ALD, the like, or any other suitable process or combination of processes. In some embodiments, the data storage film 111A is deposited by ALD or the like. In some embodiments, the channel layer 107A is deposited by ALD or the like. In some embodiments, the intracell dielectric 115A is deposited by a flowable CVD process. Following deposition of the intracell dielectric 115A, a planarization process may be used to remove any intracell dielectric 115A or other material above the mask 901.

As shown by the top view 1100A of FIG. 11A and the cross-sectional view 1100B of FIG. 11B, a mask 1103 may be formed and used to help define a pattern for selectively etching openings 1101 in the intracell dielectric 115A. The stacks 135A may be covered by the mask 901 during this etch process. The etch process may be an anisotropic etch such as a plasma etch. The etch may be selective to remove the intracell dielectric without removing the material of the channel layer 107A or that of the data storage structure 108A. Alternatively, the etch may remove exposed portions of the channel layer 107A or of both the channel layer 107A and the data storage structure 108A.

As shown by the top view 1200A of FIG. 12A and the cross-sectional view 1200B of FIG. 12B, the openings 1101 may be filled with intercell dielectric to form intercell dielectric plugs 121A. The intercell dielectric plugs 121A are formed between desired locations for memory cells 101A. The openings 1101 may be filled with intercell dielectric plugs 121A by a deposition process such as CVD. In some embodiments, the CVD process is a flowable CVD process. The flowable CVD process may provide good gap fill even if the openings 1101 have a high aspect ratio. The mask 1103 may be stripped or may be removed by a CMP process that also removes excess intercell dielectric.

As shown by the top view 1300A of FIG. 13A and the cross-sectional view 1300B of FIG. 13B, a mask 1301 with openings 1305 may be formed and used to etch openings 1303 in the intracell dielectric 115A. In accordance with some aspects of the present teachings, the openings 1305 may be elliptical. The openings 1305 are approximately centered over intercell dielectric plugs 121A. Each of the openings may have a first end that extends over the intracell dielectric 115A on one side of an intercell dielectric plug 121A and a second end that extends over an opposite side of the intercell dielectric plug 121A. This approach may facilitate making the openings 1303 large without being too close together. The etch process may be anisotropic and selective to remove the exposed intracell dielectric 115A without substantially etching either the intercell dielectric plugs 121A, the data storage film 111A, or the channel layer 107A. The etch process may be a plasma etch, the like, or any other suitable process.

As shown by the top view 1400A of FIG. 14A and the cross-sectional view 1400B of FIG. 14B, the openings 1303 may be filled with conductive material to form the source lines 103A and the drain lines 119A. Filling the openings 1303 with conductive material may include CVD, electroplating, electroless plating, the like, or any other suitable process. Excess conductive material may be removed by a planarization process such as CMP or the like. The CMP process may also remove the mask 1301, the mask 901, or both. The resulting structure may be the same as the one shown in FIG. 1A-1C.

FIGS. 15A and 15B through FIGS. 21A and 21B provide paired top view illustrations and cross-sectional view illustrations exemplifying a variation on the method of FIGS. 8A and 8B through FIGS. 14A and 14B, which variation may be used to form a memory array with features of the second 3D memory array 100B shown in FIGS. 5A-5B or some other 3D memory array. The variation begins from a structure similar to the one shown by the top view 900A of FIG. 9A and the cross-sectional view 900B of FIG. 9B, except that the stacks 135B are wider than the stacks 135A and the trenches 903 are proportionally narrower. As shown by the top view 1500A of FIG. 15A and the cross-sectional view 1500B of FIG. 15B, the stacks 135B, the variation may begin with filling the trenches 903 with intercell dielectric 1503.

As shown by the top view 1600A of FIG. 16A and the cross-sectional view 1600B of FIG. 16B, a mask 1601 may be formed and used to etch openings 1603 in the intercell dielectric 1503. The remaining intercell dielectric 1503 forms intercell dielectric plugs 121B. The openings 1603 correspond to desired locations for memory cells 101B.

As shown by the top view 1700A of FIG. 17A and the cross-sectional view 1700B of FIG. 17B, etching may take place within the openings 1603 to form recesses 127B in the gate strips 123B. The recesses 127B are bounded by the intercell dielectric plugs 121B, whereby one recess 127B is formed for each desired location for a memory cells 101B. The etch causes gate sidewalls 125B to be indented relative to dielectric sidewalls 129B. The etch may also cause gate sidewalls 125B to become concave as shown. In some embodiments, the etch is isotropic. In some embodiments, the etch is a wet etch. In some embodiments, the etch process is atomic layer etching. A difference in reactivity between the carbon-based material of the gate strips 123B and the dielectric material of the dielectric strips 131B facilitates selecting an etch chemistry that provides the desired selectivity.

As shown by the top view 1800A of FIG. 18A and the cross-sectional view 1800B of FIG. 18B, a data storage film 111B is deposited within the recesses 127B. The data storage film 111B may initially deposit conformally on the gate sidewalls 125B and the dielectric sidewalls 129B. The deposition process may be CVD, ALD, the like, or any other suitable process. Additional layers may be deposited before or after the data storage film 111B if desired for the data storage structures 108A. An anisotropic etch process may be used to remove portions of the data storage film 111B that deposit between the tiers 141A-141D and other areas outside the recesses 127B. The etch process may be a plasma etch. The mask 1501 may align the etch to the stacks 135B.

As shown by the top view 1900A of FIG. 19A and the cross-sectional view 1900B of FIG. 19B, a channel layer 107B may be deposited on the sides of the stacks 135B followed by filling of the openings 1603 with intracell dielectric 115B. The channel layers 107B may deposit conformally on the data storage films 111B and the dielectric sidewalls 129B. The deposition process may be CVD, ALD, the like, or any other suitable process. The channel layers 107B may be extend through a height of the stacks 135B. One or more additional layers may be deposited before the channel layers 107B if desired to complete the formation of the data storage structures 108B. In some embodiments, the data storage structures 108B are completed by a dielectric layer that forms during deposition of the channel layers 107B.

Optionally, all or part of the channel layer 107B may be made to deposit within the recesses 127B. In some embodiment, the data storage film 111B does not completely fill the recesses 127B. The channel layer 107B may then complete the fill of the recess 127B. In some embodiments, the data storage film 111B is etched back to provide room for the channel layer 107B in the recesses 127B. In some embodiments, the etch back includes an isotropic etch such as a wet etch. In some embodiments, the etch back includes atomic layer etching. In some embodiments, an anisotropic etch process is used to remove portions of the channel layer 107B that deposit outside the recesses 127B. In some embodiments, a second channel layer 107B is then deposited to provide a desired channel layer thickness.

The intracell dielectric 115B may be deposited by CVD, the like, or any other suitable process. In some embodiments, the deposition includes a flowable CVD process. Following deposition of the intracell dielectric 115B, a planarization process may be used to remove any intracell dielectric 115B or other material above the mask 1501.

As shown by the top view 2000A of FIG. 20A and the cross-sectional view 2000B of FIG. 20B, a mask 2001 with openings 2005 may be formed and used to etch openings 2003 in the intracell dielectric 115B. The etch process may be anisotropic and selective to remove the exposed intracell dielectric 115B without substantially etching either the intercell dielectric plugs 121B, the data storage film 111B, or the channel layer 107B. The etch process may be a plasma etch, the like, or any other suitable process.

As shown by the top view 2100A of FIG. 21A and the cross-sectional view 2100B of FIG. 21B, the openings 2003 may be filled with conductive material to form the source lines 103B and the drain lines 119B. Filling the openings 2003 with conductive material may include CVD, electroplating, electroless plating, the like, or any other suitable process. Excess conductive material may be removed by a planarization process such as CMP or the like. The CMP process may also remove the mask 2101, the mask 1501, or both. The resulting structure may be the same as the one shown in FIGS. 5A-5C.

FIGS. 22 through 29 provide cross-sectional views illustrating a variation on the method of FIGS. 8A and 8B through 14A and 14B. This alternate method may be used to avoid a process stage at which the stacks 135A are left freestanding as shown the cross-sectional view 900B of FIG. 9B. When left freestanding, the stacks 135A may have the potential to twist, collapse, or otherwise shift or deform. The method also provides an opportunity to initially form the gate layer with a dummy layer and subsequently replace that layer with a carbon-based material with the advantage that all the carbon-based material may be deposited in two operations regardless of the number of tiers in the stacks 135A.

Figure 22:
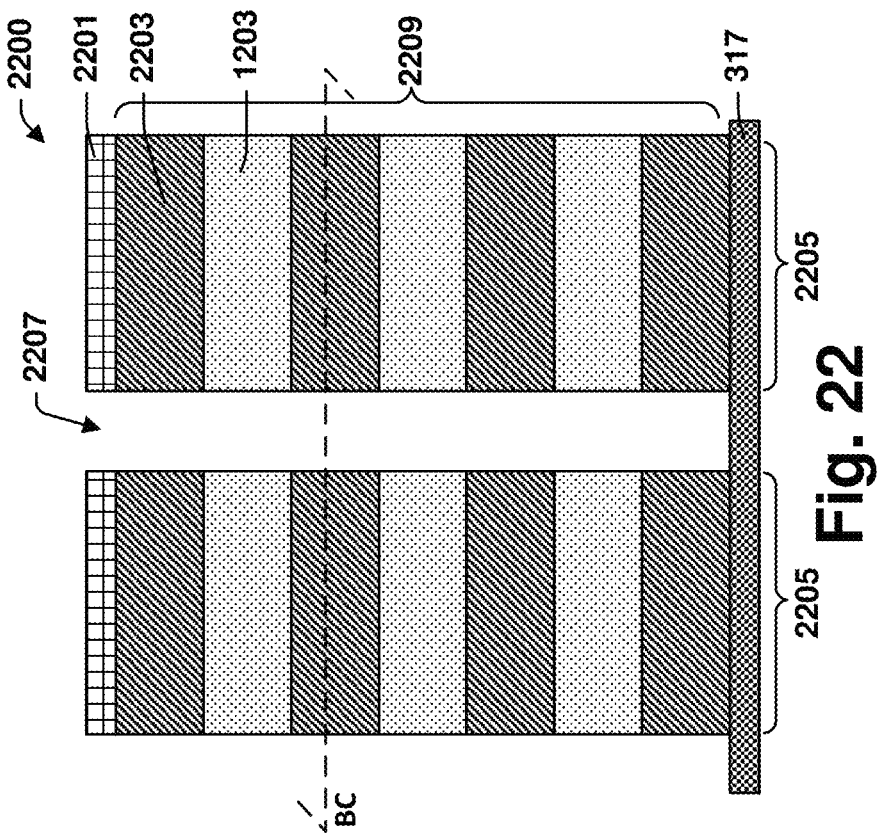

As shown by the cross-sectional view 2200 of FIGS. 22, a mask 2201 is formed and used to etch trenches 2207 that divide a broad stack 2209 into smaller stacks 2205. The broad stack 2209 may be the same as the broad stack 805 of FIG. 8B, or may have dummy gate layers 2203 in place of gate layers 801. The dummy gate layers 2203 may be a dielectric with a different etch selectivity from the dielectric layers 803. The dummy gate layers 2203 may alternatively be polysilicon, the like, or any other suitable material. The trenches 2207 may have the same dimensions as the trenches 903 of FIG. 9B but have half or less of the number density.

Figure 23:
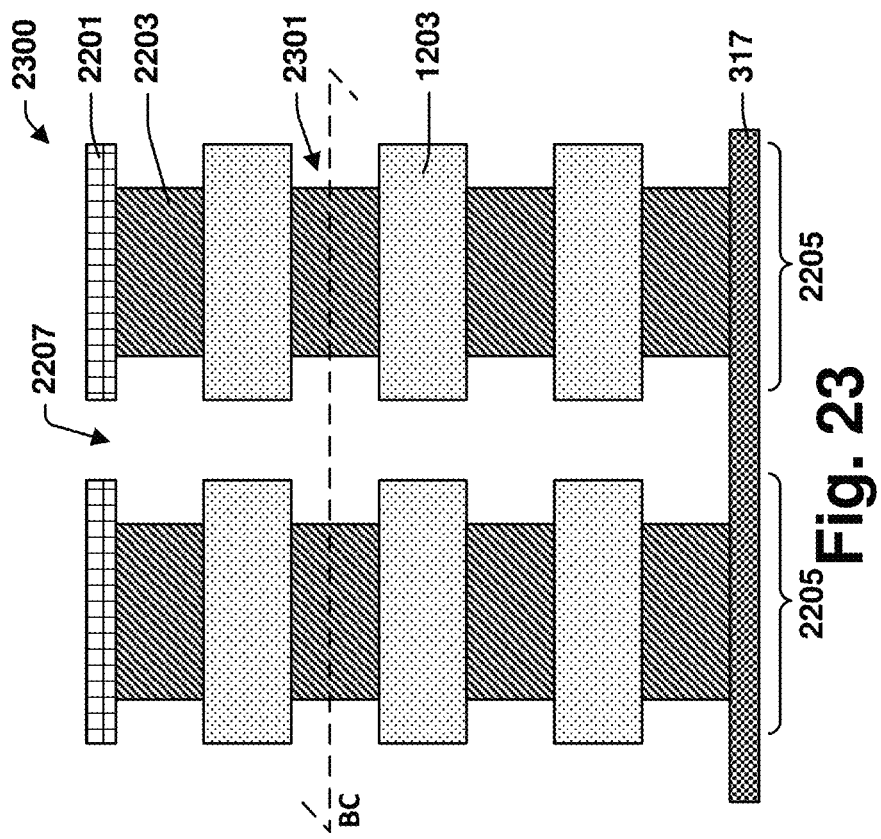
FIGS. 22 through 29 provide cross-sectional views illustrating an alternate method of forming dielectric strip/gate strip stacks according to some aspects of the present teachings.

As shown by the cross-sectional view 2300 of FIG. 23, the dummy gate layers 2203 may be etched back from the trenches 2207 to form recesses 2301 in the smaller stacks 2205. The etch process may remove approximately half a volume of the dummy gate layers 2203. The etch process may be an isotropic etch. For example, the dielectric layers 803 may be silicon oxide, the dummy gate layers 2203 may be silicon nitride, and the recesses 2301 may be formed by wet etching with phosphoric acid ($H_3PO_4$).

Figure 24:
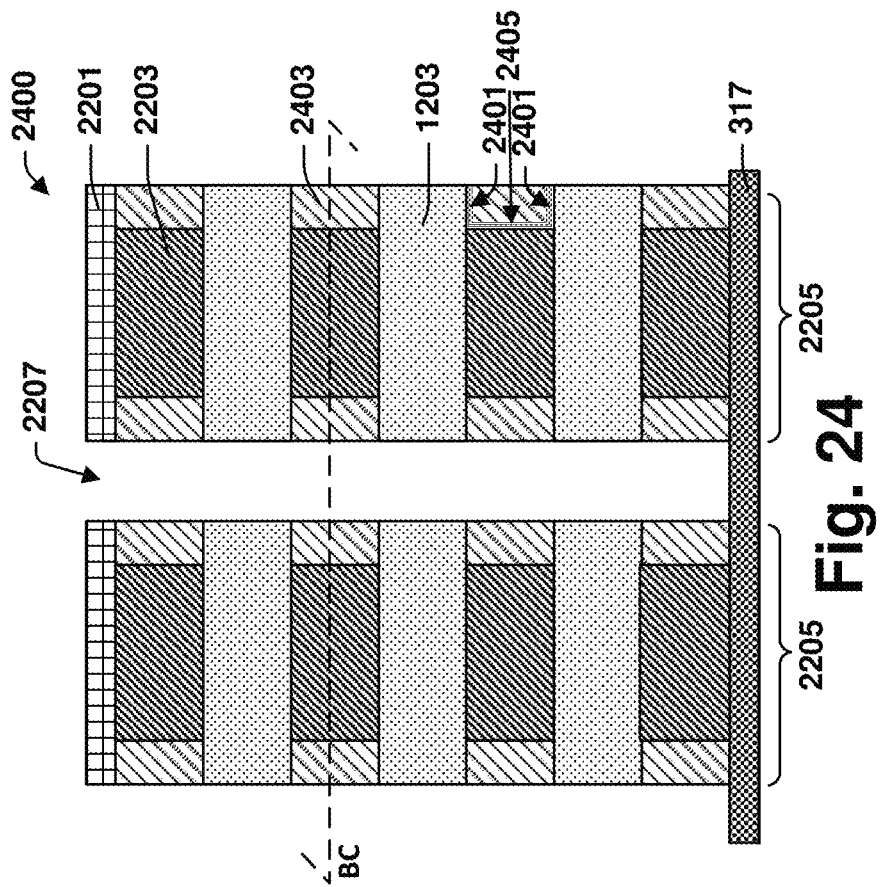
Figure 27:
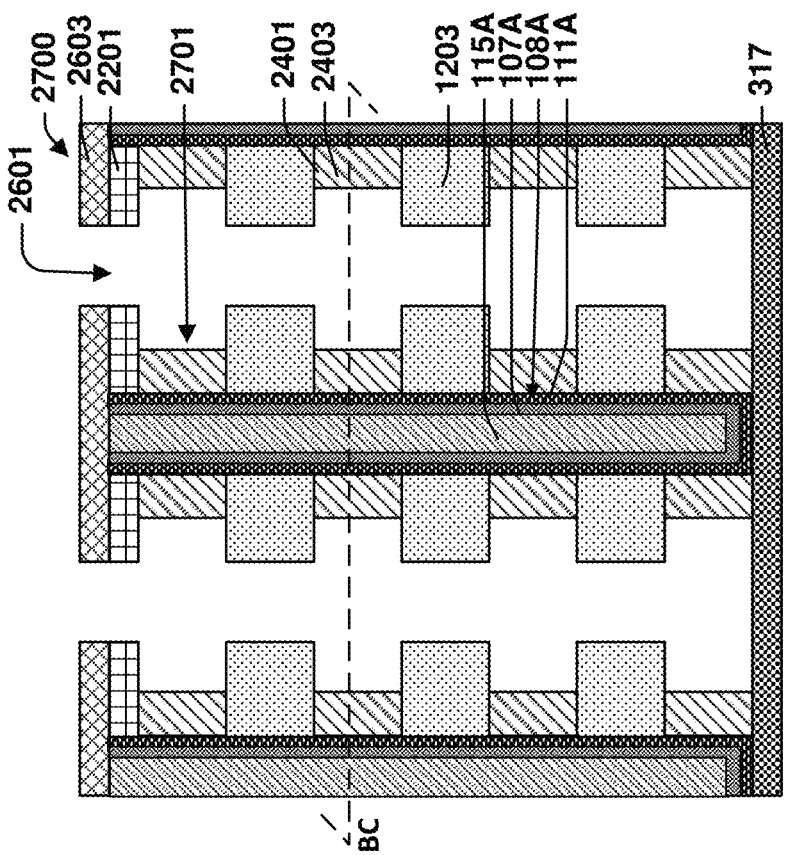

As shown by the cross-sectional view 2400 of FIG. 24, the recesses 2301 may be filled by depositing a carbon-based material layer 2403. The carbon-based material may be deposited by CVD, ALD, or any other suitable process or combination of processes. After depositing the carbon-based material layer 2403 in an amount sufficient to complete the fill of the recesses 2301, excess material may be removed by an anisotropic etch process.

The carbon-based material may deposit layer-by-layer in the form of graphene sheets. The orientation of these sheets depends on the orientation of the surface on which they deposit. In areas 2401 that are adjacent dielectric layers 1203, the sheets may have a horizontal orientation. In an area 2405 that is adjacent the not-yet-removed portion of the dummy gate layer 2203, the sheets may have a vertical orientation. The combination of the horizontally and vertically oriented sheets provides a C-shaped sheet structure.

Figure 25:
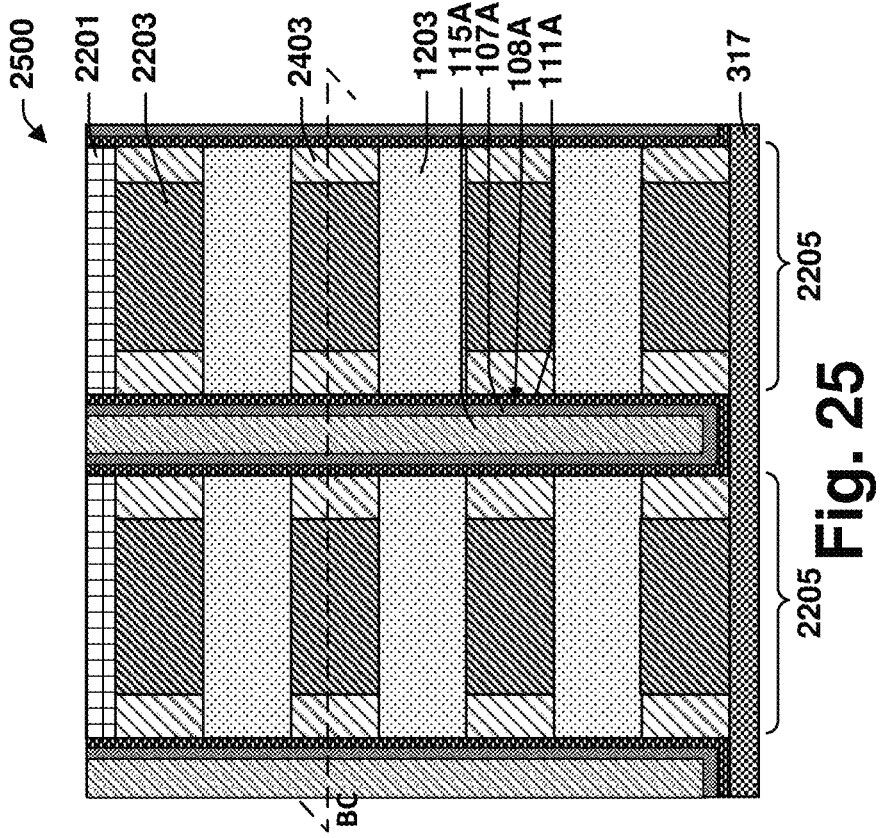

As shown by the cross-sectional 2500 of FIG. 25, the trenches 2207 are filled. In this example, the trenches are filled by the process steps shown in FIGS. 10A and 10B. These process steps form the data storage structures 108A including the data storage film 111A, form the channel layer 107A, and complete the fill of the trenches 2207 with intracell dielectric 115A. In some other embodiments, the trenches 2207 are filled by intercell dielectric, another dielectric, polysilicon, or the like.

Figure 26:
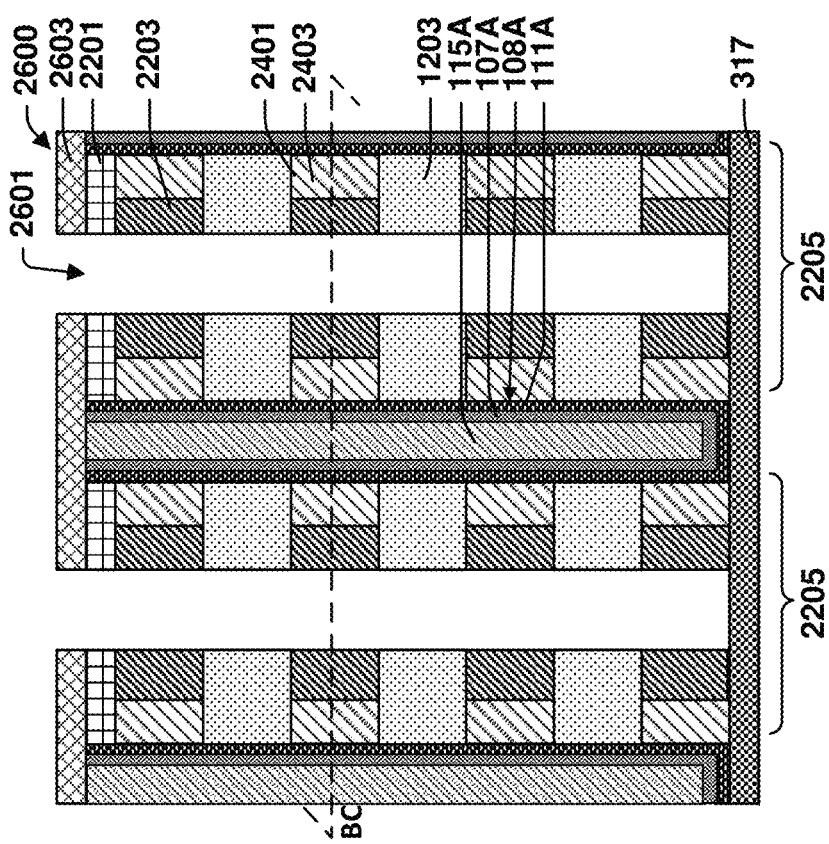

As shown by the cross-sectional view 2600 of FIG. 26, a mask 2603 may be formed and used to etch trenches 2601 in the stacks 2205. As shown by the cross-sectional view 2700 of FIG. 27, remaining portions of the dummy gate layer 2203 may be removed by etching through the trenches 2601. The removal leaves the recesses 2701. As shown by the cross-sectional view 2800 of FIG. 28, the recesses 2701 may be filled by depositing a second carbon-based material layer 2803. Excess material in the trenches 2601 may be removed by anisotropic etching. The process steps shown in FIGS. 10A and 10B may then be repeated and the mask 2603 removed to provide a structure as shown by the cross-sectional view 2900 of FIG. 29. The method of FIGS. 22 through 29 or the like, with or without the replacement gate process steps, may be used to form other structures in accordance with other embodiments and examples provided herein to provide the advantage of preventing twisting, collapsing or other deformation that may occur with narrow free standing stacks.

FIGS. 30A and 30B through FIGS. 34A and 34B provide paired cut-away top view and cross-sectional view illustrations exemplifying a method according to the present teachings of forming a device comprising a 3D memory array with features of the fourth 3D memory array 100D or the like. The "A" figures are cut-away top views with the cutaway taken along the line "A" indicated in the "B" figures. The "B" figures are vertical cross-sections through the line "A". While FIGS. 30A and 30B through FIGS. 34A and 34B are described with reference to various embodiments of a method, it will be appreciated that the structures shown in FIGS. 30A and 30B through FIGS. 34A and 34B are not limited to the method but rather may stand alone separate from the method. While FIGS. 30A and 30B through FIGS. 34A and 34B are described as a series of acts, it will be appreciated that the order of the acts may be altered in other embodiments. While FIGS. 30A and 30B through FIGS. 34A and 34B illustrate and describe a specific set of acts, some acts that are illustrated and/or described may be omitted in other embodiments. Further, acts that are not illustrated and/or described may be included in other embodiments. While the method of FIGS. 30A and 30B through FIGS. 34A and 34B is described in terms of forming the fourth 3D memory array 100D, the method may be used to form other memory arrays.

As shown by the cut-away top view 3000A of FIG. 30A and the cross-sectional view 3000B of FIG. 30B, the method begins with forming a broad stack 3007 over a dielectric layer 317. The broad stack 3007 includes repeating sets of layers 3015. Each set of layers 3015 corresponds to one tier of memory cells in the resulting memory device. Each set of layers 3015 includes two contact layers 3001, a first dielectric layers 3003, and a second dielectric layer 3005. The first dielectric layers 3003 and the second dielectric layer 3005 have different compositions and may have different thicknesses. In some embodiments, the contact layers 3001 are dummy layers that are later replaced by carbon-based material to provide gate strips. In other embodiments, the contact layers 3001 are carbon-based materials.

As shown by the cut-away top view 3100A of FIG. 31A and the cross-sectional view 3100B of FIG. 31B, trenches 3101 are formed to divide the broad stack 3007 into a series of stacks 135D. The stacks 135D include conductive strips 123D formed from the contact layers 3001, intracell dielectric strips 115D formed from the first dielectric layers 3003, and intercell dielectric strips 131D formed from the second dielectric layers 3005.

As shown by the cut-away top view 3200A of FIG. 32A and the cross-sectional view 3200B of FIG. 32B, a selective etch process within the trenches 3101 is used to create recesses 3201 in the stacks 135D. The etch is selective to remove the material of the intracell dielectric strips 115D over the materials of the intercell dielectric strips 131D and of the conductive strips 123D. The etch process may be a wet etch, the like, or some other suitable type of etching. In some embodiments, the etch process is an atomic layer etch.

As shown by the cut-away top view 3300A of FIG. 33A and the cross-sectional view 3300B of FIG. 33B, channel layers 107D are deposited within the recesses 3201. The channel layers 107D may initially deposit conformally on the stacks 135D. The deposition process may be CVD, ALD, the like, or any other suitable process. An anisotropic etch process may be used to remove portion of the channel layers 107D outside the recesses 3201. The etch process may be a plasma etch aligned to the stacks 135D.

As shown by the cut-away top view 3400A of FIG. 34A and the cross-sectional view 3400B of FIG. 34B, the layers of a data storage structure 108D, including a data storage film 111D, may be deposited on the sides of the stacks 135D followed by filling of the trenches 3101 with intercell dielectric plugs 121D. The data storage film 111D may deposit conformally on the stacks 135D. Additional layers may be deposited before or after the data storage film 111D if desired for the data storage structures 108D. In some embodiments, the data storage structures 108D include a dielectric layer that forms during deposition of the data storage film 111D by reaction with material of the channel layers 107D. The deposition processes may be CVD, DLD, the like, or any other suitable process or combination of processes. In some embodiments, the data storage film 111D is deposited by ALD or the like. In some embodiments, the intercell dielectric plugs 121D are deposited by a flowable CVD process.

As shown by the cut-away top view 3500A of FIG. 35A and the cross-sectional view 3500B of FIG. 35B, openings 3501 may be etched in the intercell dielectric plugs 121D. The etch process may be an anisotropic etch such as a plasma etch. The openings 3501 may then be filled with conductive material to produce the structure shown in FIGS. 7A-7B. The fill process may include CVD, electroplating, electroless plating, the like, or any other suitable process.

Figure 36:
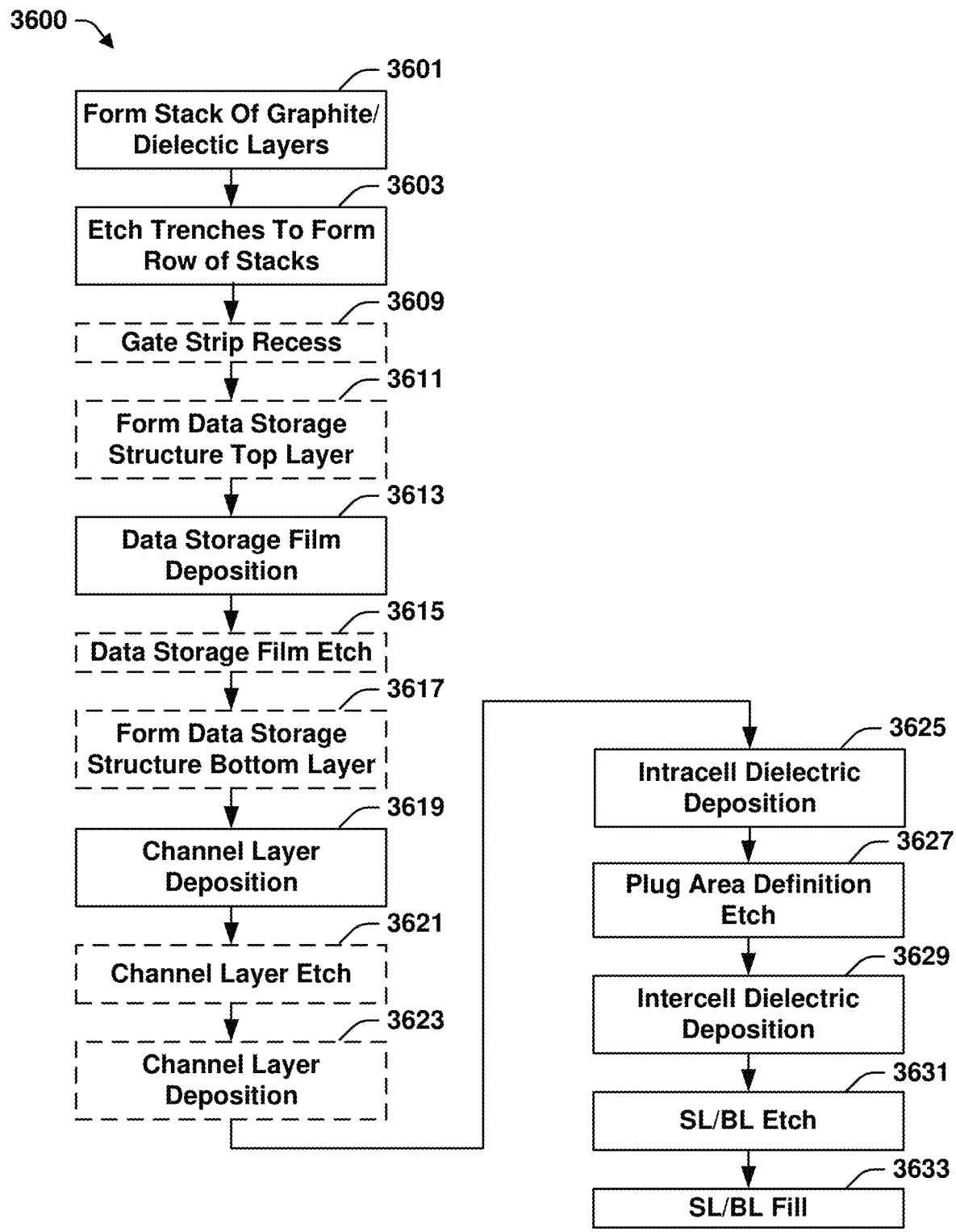
FIGS. 36-39 provide flow charts illustrating various method according to the present teachings that may be used to form 3D memory arrays.

FIG. 36 presents a flow chart for a method 3600 which may be used to form a 3D memory array according to the present disclosure. The method 3600 begins with act 3601, forming a broad stack including a plurality of layer of carbon-based conductive material separated by dielectric layers. The cross-sectional view 800B of FIG. 8B provides an example.

Act 3603 is etching trenches in the broad stack to form a row of narrow stacks of alternating gate strips and dielectric strips as shown by the cross-sectional view 900B of FIG. 9B.

Act 3609 is an optional act of etching the gate strips to form recesses in the narrow stacks. The cross-sectional view 1700B of FIG. 7B provides an example.

Act 3611 is an optional step of forming a top layer of a data storage structure. "Top" is used with reference to the ordering of layers seen in a horizontal memory cell. In particular, the top layer is one or more layers formed between the data storage film and the control gate. The dielectric layer 173 shown in FIGS. 6A and 6B is an example.

Act 3613 is depositing a data storage film. The cross-sectional view 1000B of FIG. 10B and the cross-sectional view 1800B of FIG. 18B provide examples.

Act 3615 is an optional step of etching to remove the data storage film from outside the recesses. This action is used in connection with the optional Act 3609, in which the recesses are formed. The cross-sectional view 1800B of FIG. 18B provides an example. The etching may include a directional or anisotropic etch. The etching may also include an isotropic etch that cause the data storage film to be indented within the recesses.

Act 3617 is an optional step of forming a bottom layer of the data storage structure. "Bottom" is used with reference to the ordering of layers seen in a horizontal memory cell. In particular, the bottom layer is one or more layers formed between the data storage film and the channel. The dielectric layer 171 shown in FIGS. 6A and 6B is an example.

Act 3619 is depositing a channel layer. The cross-sectional view 1000B of FIG. 10B and the cross-sectional view 1800B of FIG. 18B provide examples.

Act 3621 is an optional step of anisotropic etching to remove a portion of the channel layer that is outside the recesses. This action is an option when Act 3609 has formed the recesses and the data storage structure has not filled the recesses.

Act 3623 is an optional step of depositing another layer of the channel material. This action may be used in connection with optional Act 3621, which may leave the channel layer too thin.

Act 3625 is depositing the intracell dielectric to fill the trenches between the stacks. The cross-sectional view 1000B of FIG. 10B provides an example.

Act 3627 is etching to form openings in the intracell dielectric for intercell dielectric plugs. The cross-sectional view 1100B of FIG. 11B provides an example. Act 3629 is filling the opening with intercell dielectric to form the intercell dielectric plugs. The cross-sectional view 1200B of FIG. 12B provides an example. Alternatively, the trenches may be first filled with the intercell dielectric and the intracell dielectric deposited into openings that are etched into the intercell dielectric. The resulting structure may be substantially the same as the one shown by the cross-sectional view 1200B of FIG. 12B which provides an example Act 3631 is etching opening in the intracell dielectric in which to form vertical connectors such as source lines and bit lines. This etch may be aligned in part by the intercell dielectric plugs. The top view 1300A of FIG. 13A provides an example.

Act 3633 is filling the openings to provide vertical conductive structures such as source lines and bit lines. The top view 1400A of FIG. 14A provides an example.

Figure 37:
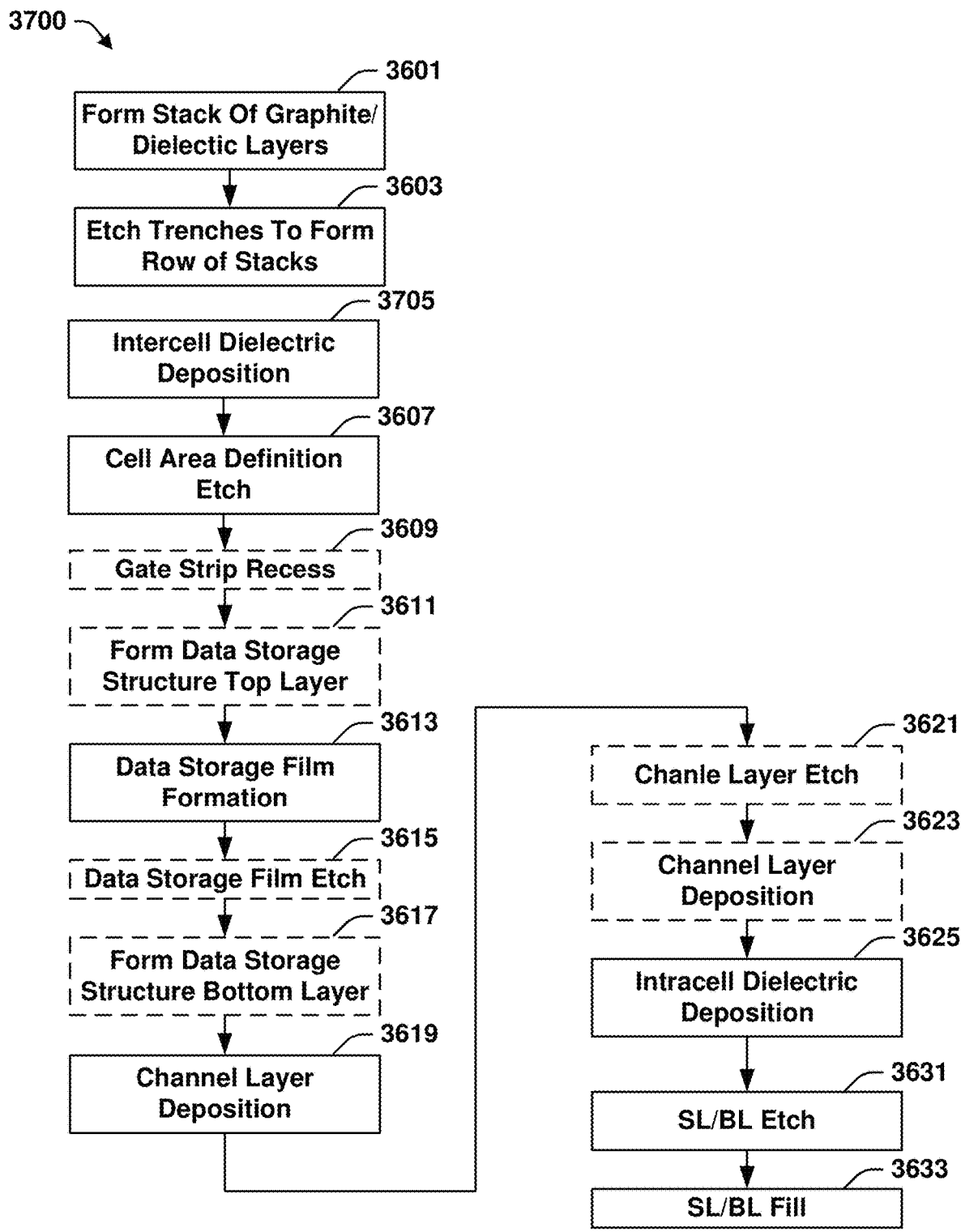

FIG. 37 presents a flow chart for a method 3700, which is another method that may be used to form a 3D memory array according to the present disclosure. The method 3700 include many of the same acts as the method 3600. A principal difference is that in the method 3700, the intracell dielectric plugs are formed before the channel layer and the data storage structure. Another option is to form the intracell dielectric plugs after depositing the data storage film but before depositing the channel layer.

The method 3700 begins with Act 3601, forming the broad stack, Act 3603 etching trenches in the broad stack to form narrow stacks, and Act 3705, filling the trenches with the intercell dielectric. The top view 1500A of FIG. 15A and the cross-sectional view 1500B of FIG. 15B provide an example.

Act 3607 is a cell area definition etch. The top view 1600A of FIG. 16A and the cross-sectional view 1600B of FIG. 16B provide an example of performing this etch at this stage of processing.

The method may continue with the optional Act 3609, the gate strip recess. The top view 1700A of FIG. 17A and the cross-sectional view 1700B of FIG. 17B provides an example.

The method may continue with optional Act 3611, forming a data storage structure top layer.

The method 3700 continues with Act 3613, forming the data storage film. This may be followed by optional Act 3615, etching to confine the data storage film to the recesses. The top view 1800A of FIG. 18A and the cross-sectional view 1800B of FIG. 18B provides an example.

The method 3700 continues with Act 3619, the channel layer deposition, and Act 3625, the intracell dielectric deposition. The top view 1900A of FIG. 19A and the cross-sectional view 1900B of FIG. 19B provides an example. As in method 3600, if the gate strips have been recessed and the data storage structure does not fill the recesses, Act 3621 may be used to remove channel material outside the recesses and Act 3623 may be used to deposit an additional channel layer.

The method 3700 continues with Act 3631 and Act 3633. Act 3631 is etching opening in the intracell dielectric in which to form vertical connectors such as source lines and bit lines. The top view 2000A of FIG. 20A provides an example. Act 3633 is filling the openings to provide vertical conductive structures such as source lines and bit lines. The top view 2100A of FIG. 21A provides an example.

Figure 38:
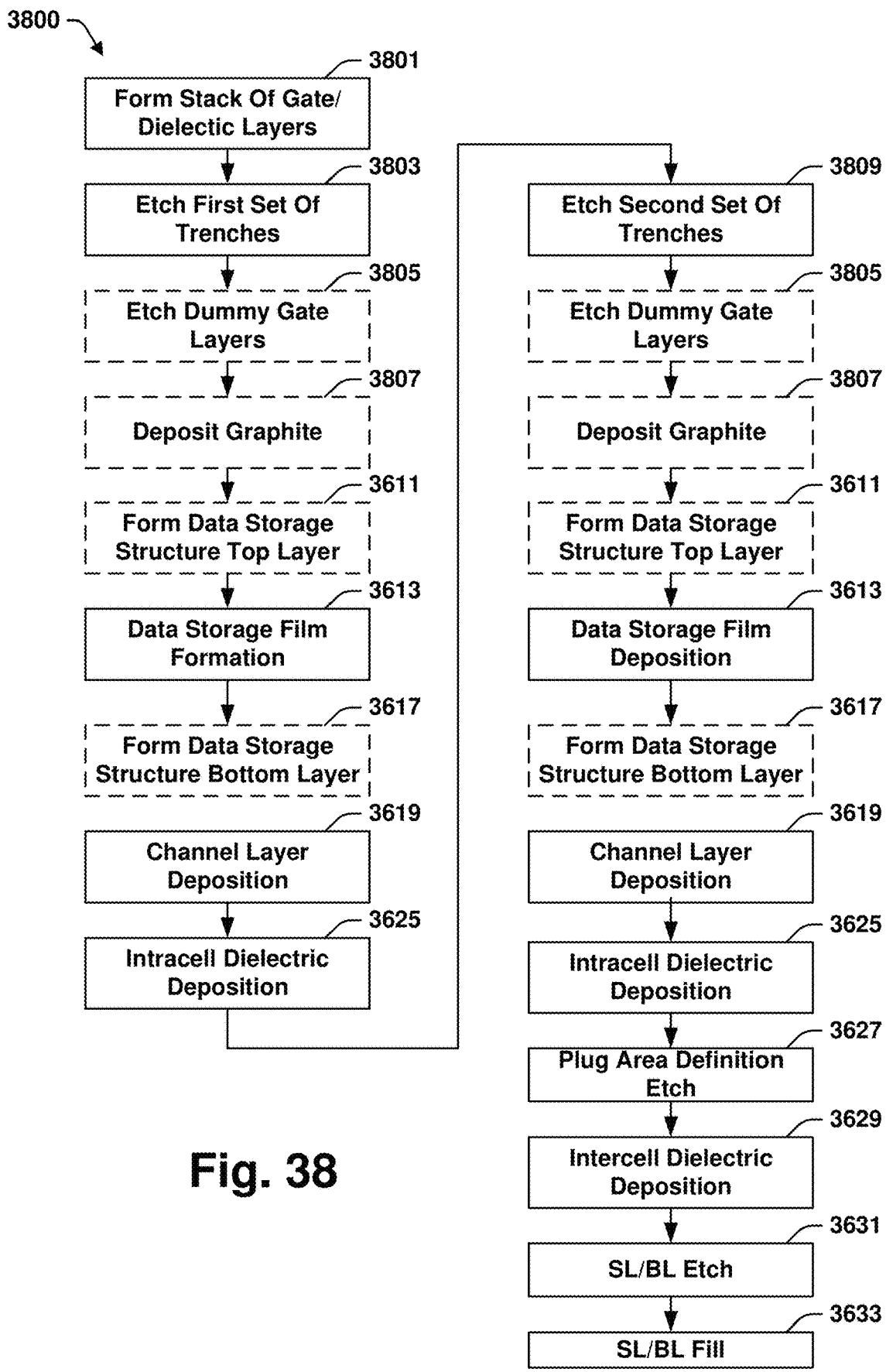

FIG. 38 presents a flow chart for a method 3800, which is another method that may be used to form a 3D memory array according to the present disclosure. The method 3800 include many of the same acts as the method 3600, but uses the type of processing illustrated by FIGS. 22-29.

The method 3800 includes act 3801, forming a broad stack of alternating gate layers and dielectric layers. This may be the same as act 3601 except that the gate layers may be dummy gate layers. The cross-sectional view 800B of FIG. 8B provides an example.

Act 3803 is forming a first set of trenches. The cross-sectional view 2200 of FIG. 22 provides an example. These trenches are half or less in number compared to the trenches formed by act 3603 for which the cross-sectional view 900B of FIG. 9B provides an example.

Acts 3805 and 3807 are optional steps that are used when the gate layer is a dummy layer. Act 3805 is etching away a first portion of the dummy layer to form recesses. The cross-sectional view 2300 of FIG. 23 provides an example. Act 3807 is filling the recesses with a carbon-based conductor. The cross-sectional view 2400 of FIG. 24 provides an example. Any conductive material that deposits outside the recess 2301 may be removed by anisotropic etching.

The method 3800 continues with act 3611 through act 3625 which may be the same as in the method 3600 except that they operate within only the first set of trenches. The cross-sectional view 2500 of FIG. 25 provides an example.

Figure 28:
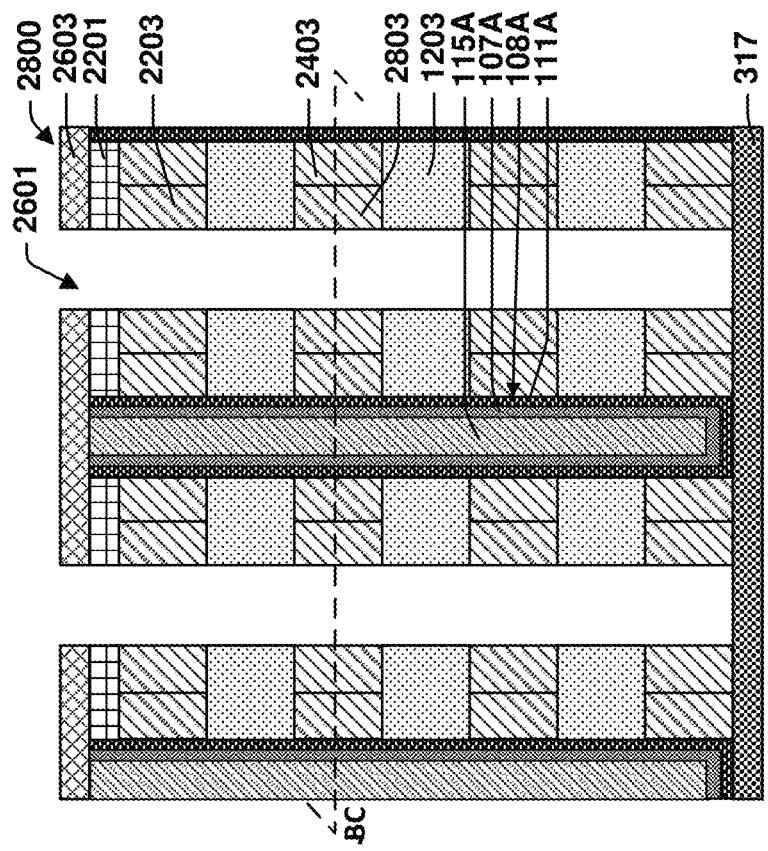

Act 3809 is forming a mask and etching a second set of trenches. The cross-sectional view 2600 of FIG. 26 provides an example. If the gate layer is a dummy gate layer, the method may continue with a repetition of Act 3805 and Act 3807 to complete the gate replacement process. The cross-sectional view 2700 of FIG. 27 and the cross-sectional view 2800 of FIG. 28 provide an example.

Figure 29:
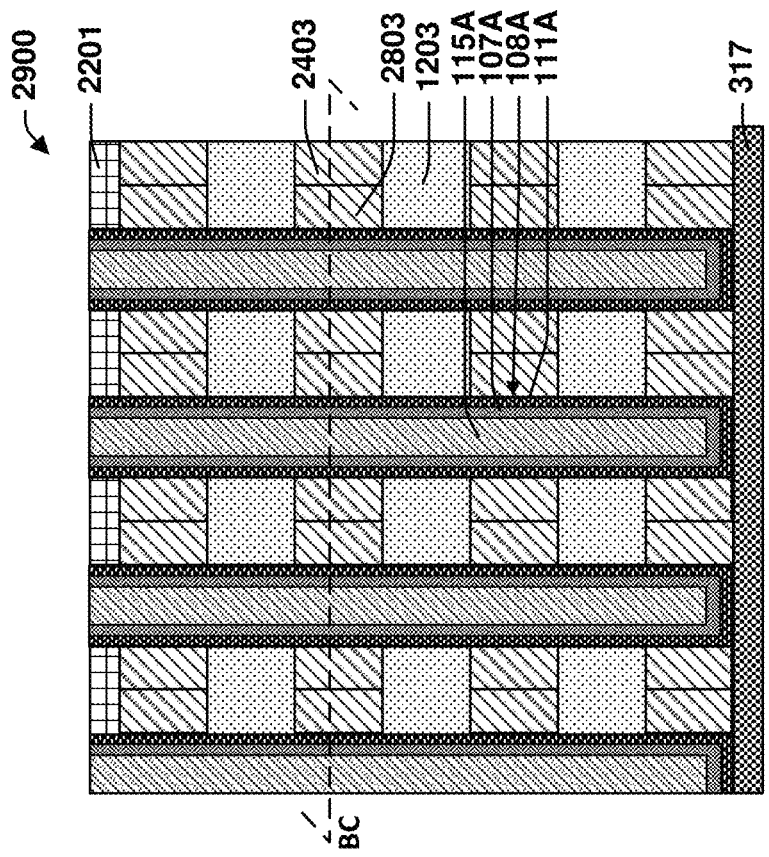

The method 3800 continues with a repetition of act 3611 through act 3625. The cross-sectional view 2900 of FIG. 29 provides an example. Processing may continue with act 3627 through act 3633 as described in connection with the method 3600.

Figure 39:
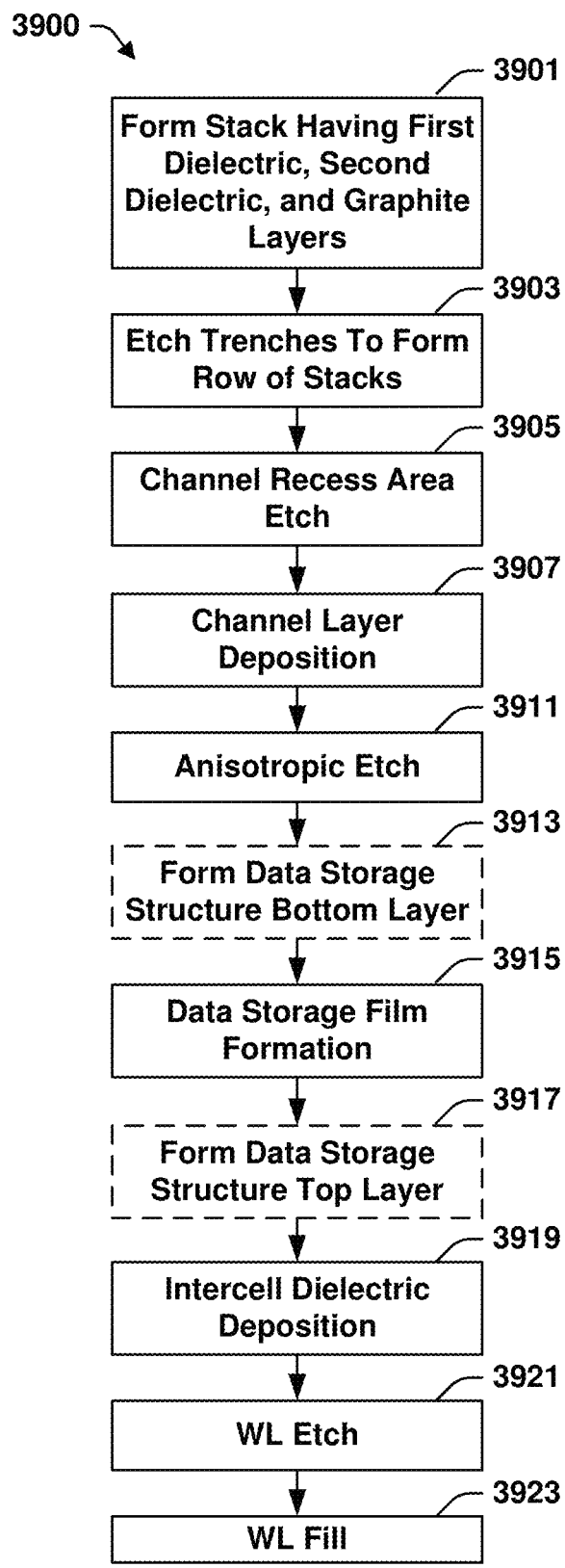

FIG. 39 presents a flow chart for a method 3900, which is another method that may be used to form a 3D memory array according to the present disclosure. The method 3900 begins with Act 3901, forming a broad stack. In this example, the broad stack includes layers of a first dielectric, layers of a second dielectric, and layers of carbon-based conductor. The cross-sectional view 3000B of FIG. 30B provides an example. Optionally, the procedure of method 3800 may be employed, in which case dummy layers may be used in place of the layers of carbon-based conductor.

Act 3903 is etching trenches in the broad stack to form a row of narrow stacks. The cut-away top view 3100A of FIG. 31A and the cross-sectional view 3100B of FIG. 31B provide an example.

Act 3905 is selectively etching one of the dielectrics to form recesses in the narrow stacks. The cut-away top view 3200A of FIG. 32A and the cross-sectional view 3200B of FIG. 32B provide an example.

Act 3907 is depositing a channel layer within the trenches. The channel layer may fill the recesses. Act 3911 is an anisotropic etch that removes a portion of the channel layer that is outside the recesses. The cut-away top view 3300A of FIG. 33A and the cross-sectional view 3300B of FIG. 33B provide an example.

Act 3913 is an optional action of depositing a data storage structure bottom layer in the trenches. Act 3915 is depositing a data storage film in the trenches. Act 3917 is an optional action of depositing a data storage structure top layer over the data storage film. Act 3919 is completing the trench fill with an intercell dielectric. The cut-away top view 3400A of FIG. 34A and the cross-sectional view 3400B of FIG. 34B provide an example.

Act 3921 is etching vertical openings in the intercell dielectric. The cut-away top view 3500A of FIG. 35A and the cross-sectional view 3500B of FIG. 35B provide an example. Act 3923 is filling the openings with conductive material to form vertical connectors, which may be used as word lines. FIGS. 7A and 7B provide an example of a resulting structure.

While the methods 3600, 3700, 3800, and 3900 of FIG. 36-39 are illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Some aspects of the present teachings relate to a device having a three-dimensional array of memory cells disposed between two adjacent metal interconnect layers in a metal interconnect structure. Each of the memory cells includes a source side, a drain side, a channel, a control gate, and a data storage film. The channel extends between the source side and the drain side. The data storage film is between the control gate and the channel. The three-dimensional array of memory cells further includes an array of stacks, each stack comprising a plurality of conductive strips and a plurality of dielectric strips. Thee conductive strips extend horizontally to connect with a plurality of the memory cells and are formed of a carbon-based conductive material.

Some aspects of the present teachings relate to a memory device that includes a plurality of stacks. Each stack has a vertical arrangement of two or more gate strips formed of conductive carbon-based material such as graphite. The gate strips are separated by dielectric strips. Source lines and drain lines are positioned between the stacks and extend along the vertical direction. The memory cells each has a channel extending between one of the source lines and one of the drain lines and a data storage structure positioned between the channel and one of the gate strips.

Some aspects of the present teachings relate to a method of forming a memory device that includes forming a broad stack having a plurality of conductive layers and a plurality of dielectric layers. The conductive layers comprise a carbon-based material. Trenches are etching in the broad stacks to form a plurality of narrow stacks. A data storage film is deposited in the trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, the method comprising:
   forming a first stack comprising a plurality of conductive layers separated by dielectric layers, wherein the conductive layers comprise a carbon-based material and the dielectric layers alternate between layers of a first dielectric material and layers of a second dielectric material, the second dielectric material having a composition that is distinct from that of the first dielectric material;
   etching trenches in the first stack to form a plurality of second stacks; and
   depositing a data storage film within the trenches.

2. The method of claim 1, further comprising:
   before depositing the data storage film, selectively etching to form recesses in the second stacks, wherein the recesses form adjacent the conductive layers; and
   after depositing the data storage film, etching to remove a portion of the data storage film that is outside the recesses.

3. The method of claim 2, further comprising forming dielectric plugs in the trenches before forming the recesses.

4. The method of claim 1, further comprising:
   depositing a channel layer over the data storage film;
   filling trenches between stacks with a second dielectric;
   etching opening through the second dielectric, wherein the openings extend to a top of the stack to a bottom of the stack; and
   filling the openings with metal to form source lines and drain lines that extend from the top of the stack to the bottom of the stack.

5. The method of claim 1, wherein the carbon-based material is graphene.

6. The method of claim 1, wherein the carbon-based material comprises graphene nanoribbons.

7. The method of claim 1, wherein the carbon-based material is nano-crystalline graphite.

8. The method of claim 1, further comprising:
   before depositing the data storage film, selectively etching the dielectric layers to form recesses in the second stacks, wherein the selectivity is for etching the second dielectric material over the first dielectric material and over the carbon based material so that the recesses form in every other dielectric material layer in the second stacks; and
   filling the recesses with semiconductor.

9. The method of claim 1, further comprising forming dielectric plugs in the trenches before depositing the data storage film.

10. The method of claim 1, further comprising:
    forming dielectric plugs in the trenches; and
    after forming the dielectric plugs, depositing a semiconductor layer within the trenches.

11. The method of claim 1, further comprising:
    depositing a channel layer over the data storage film;
    forming dielectric plugs in the trenches;
    filling areas of the trenches between the dielectric plugs with a second dielectric;
    etching opening through the second dielectric; and
    filling the openings with metal to form source lines and drain lines.

12. A method of forming a memory device, the method comprising:
    forming a stack comprising carbon-based material layers interleaved with dielectric layers;
    etching trenches in the stack;

depositing a ferroelectric film and a semiconductor film within the trenches; and forming vertical conductive columns within the trenches;

wherein the vertical conductive columns provide source lines and drain lines and the carbon-based material layers provide word lines for memory cells; and the source lines and the drain lines each contact the semiconductor film at heights in the stack corresponding to each of the carbon based material layers.

13. The method of claim 12, wherein the carbon-based material layers are in direct contact with the dielectric layers.

14. The method of claim 12, further comprising etching the dielectric layers from within the trenches to form recesses.

15. The method of claim 14, wherein the ferroelectric film deposits within the recesses.

16. The method of claim 12, forming dielectric plugs in the trenches before depositing the semiconductor film.

17. The method of claim 12, further comprising:

after depositing the semiconductor film, filling the trenches with a second dielectric; and forming a first mask and etching the semiconductor film and the second dielectric through the first mask to form holes, wherein the holes divides the semiconductor film along a lengthwise direction of the trenches.

18. The method of claim 17, further comprising:

filling the holes with a third dielectric to form dielectric plugs;

forming a second mask having openings extending across the dielectric plugs;

selectively etching the second dielectric through the openings to form second holes; and filling the second holes to form the vertical conductive columns.

19. A method of forming a memory device, the method comprising:

forming a stack comprising a plurality of dummy layers interleaved with dielectric layers;

etching first trenches in the stack;

etching within the first trenches to remove a first portion of the dummy layers and create first recesses;

filling the first recesses with a carbon-based material;

depositing a data storage film and a semiconductor film with the first trenches;

etching second trenches in the stack;

etching within the second trenches to remove a second portion of the dummy layers and create second recesses; and filling the second recesses with a carbon-based material.

20. The method of claim 19, further comprising:

forming source lines in the first trenches, wherein the source lines extend vertically through the stack so as to contact the semiconductor film at heights corresponding to each of the first recesses that are filled with the carbon-based material; and the source lines are of a material that is distinct from the semiconductor film.

\* \* \* \* \*